United States Patent
Huang et al.

(10) Patent No.: US 11,687,189 B2
(45) Date of Patent: Jun. 27, 2023

(54) TOUCH DISPLAY DEVICE

(71) Applicant: HANNSTAR DISPLAY CORPORATION, Taipei (TW)

(72) Inventors: Sz-Kai Huang, Taichung (TW);
Cheng-Yen Yeh, Taichung (TW);
Mu-Kai Kang, Tainan (TW);
Jing-Xuan Chen, Tainan (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 15 days.

(21) Appl. No.: 17/522,887

(22) Filed: Nov. 9, 2021

(65) Prior Publication Data
US 2022/0164052 A1    May 26, 2022

(30) Foreign Application Priority Data
Nov. 26, 2020    (CN) .......................... 202011347830.3

(51) Int. Cl.
| | | |
|---|---|---|
| G02F 1/1368 | (2006.01) | |
| G06F 3/041 | (2006.01) | |
| G02F 1/1362 | (2006.01) | |
| G02F 1/1343 | (2006.01) | |
| H01L 27/12 | (2006.01) | |
| G02F 1/1333 | (2006.01) | |

(52) U.S. Cl.
CPC ........ *G06F 3/04164* (2019.05); *G02F 1/1368* (2013.01); *G02F 1/13338* (2013.01); *G02F 1/134309* (2013.01); *G02F 1/136286* (2013.01); *G06F 3/0412* (2013.01); *H01L 27/124* (2013.01); *G09G 2300/08* (2013.01); *H01L 27/1248* (2013.01)

(58) Field of Classification Search
CPC ............. G06F 3/04164; G02F 1/13338; G02F 1/134309; G02F 1/136286; H01L 27/124
See application file for complete search history.

(56) References Cited

U.S. PATENT DOCUMENTS

2016/0328074 A1*  11/2016  Peng ..................... G06F 3/0412
2021/0318583 A1*  10/2021  Shin ................. G02F 1/134309

* cited by examiner

*Primary Examiner* — James A Dudek
(74) *Attorney, Agent, or Firm* — Winston Hsu

(57) ABSTRACT

A touch display device is disclosed. The touch display device includes a substrate, a scan line, a data line, a scan signal line, a thin film transistor, a touch signal line and a touch electrode. The scan line, the data line, the scan signal line, the thin film transistor, the touch signal line and the touch electrode are disposed on the substrate. An extending direction of the scan line is different from an extending direction of the data line, and the scan line and the data line are electrically connected to the thin film transistor. An extending direction of the scan signal line is different from the extending direction of the scan line, and the scan signal line is electrically connected to the scan line. The touch signal line is electrically connected to the touch electrode.

20 Claims, 22 Drawing Sheets

TOUCH DISPLAY DEVICE

BACKGROUND OF THE INVENTION

1. Field of the Invention

The present invention relates to a touch display device, and more particularly to an in-cell touch display device.

2. Description of the Prior Art

In various electronic products, the display screen has been widely used with touch elements to form a touch display device, the user can directly communicate with the electronic products, and conventional input devices such as keyboards and mouses can be replaced, thereby reducing the volume of the electronic product and improving the convenience of human-machine communication. The industry nowadays is committed to developing an in-cell touch display device with touch elements disposing in the display panel to minimize the touch display device.

Currently, the in-cell touch display devices are developing as full-screen, and the border width of the in-cell touch display device must be reduced to achieve the narrow-border or no-border design. Therefore, how to reduce the border width has become one of the important research issues in this field.

SUMMARY OF THE INVENTION

One of the technical problems to be solved in the present invention is how to reduce the border width of an in-cell touch display device.

To solve the technical problem described above, the present invention provides a touch display device including a display region and a peripheral region. The touch display device further includes a substrate, a scan line, a data line, a thin film transistor, a scan signal line, a touch signal line and a touch electrode. The scan line and the data line are disposed on the substrate, and the extending direction of the scan line in the display region is different from the extending direction of the data line in the display region. The thin film transistor is disposed on the substrate and in the display region. The scan line is electrically connected to a gate of the thin film transistor, and the data line is electrically connected to a source of the thin film transistor. The scan signal line is disposed on the substrate. The extending direction of the scan signal line in the display region is different from the extending direction of the scan line in the display region, and the scan signal line is electrically connected to the scan line. The touch signal line and the touch electrode are disposed on the substrate, and the touch signal line is electrically connected to the touch electrode.

In the touch display device of the present invention, the scan signal lines extending along the second direction are disposed in the display region, and the gate driving circuit is disposed below the display region in the second direction, thus the scan lines or the gate driving circuit are prevented from being disposed in the peripheral region on the left and right sides of the display region, and border widths on the left and right sides of the touch display device can be effectively reduced.

These and other objectives of the present invention will no doubt become obvious to those of ordinary skill in the art after reading the following detailed description of the preferred embodiment that is illustrated in the various figures and drawings.

DETAILED DESCRIPTION

To facilitate better understanding of the present invention by those skilled in the art, preferred embodiments of the present invention are outlined below; figures may also be taken in conjunction with the paragraphs below to detail the components of the present invention and the corresponding effects to be achieved. It should be noted that the figures are simplified schematic diagrams that only illustrate components and relationships thereof relevant to the present invention, so that basic structures and/or methods of implementation of the present invention may be more clearly described; actual components and layout thereof may be more complex. Furthermore, for the purpose of illustrative clarity, components shown in the figures of the present invention may not be drawn to scale; the numbers and shapes of the components also may not correlate to those of the actual product. Dimensions and sizes may be adjusted depending on design requirements.

Figure 1:
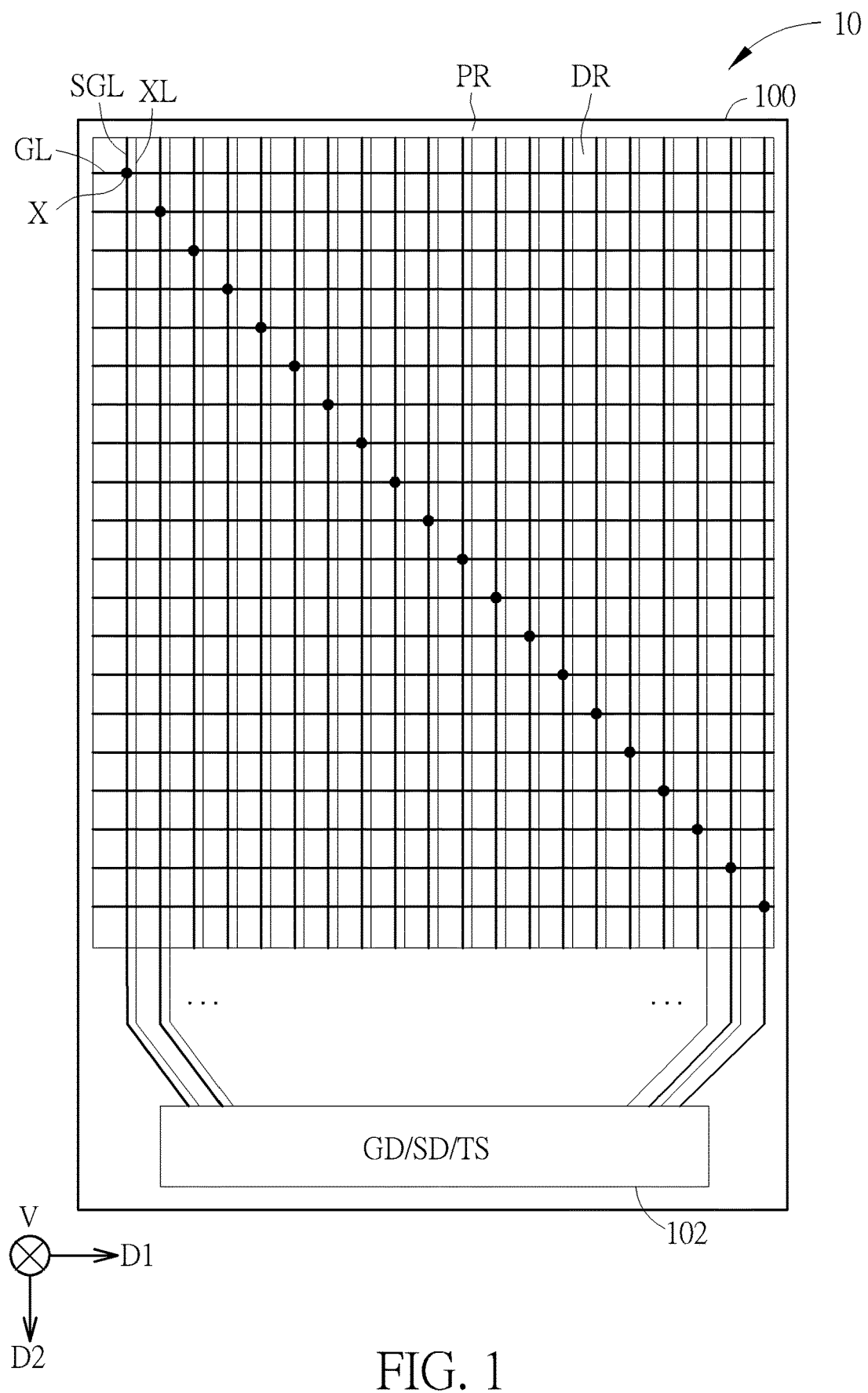
FIG. 1 is a top-view schematic diagram of a touch display device of a first embodiment according to the present invention.

Please refer to FIG. 1, which is a top-view schematic diagram of a touch display device of a first embodiment according to the present invention. The touch display device 10 of this embodiment takes an in-cell liquid crystal touch display device as an example, but not limited herein. As shown in FIG. 1, the touch display device 10 includes a display region DR and a peripheral region PR, and the peripheral region PR is disposed on at least one side of the display region DR. In this embodiment, the peripheral region PR surrounds the display region DR, but not limited herein. The touch display device 10 includes a substrate 100, and the substrate 100 may be a rigid substrate such as a glass substrate, a plastic substrate, a quartz substrate or a sapphire substrate, or the substrate 100 may be a flexible substrate including materials such as polyimide (PI) or polyethylene terephthalate (PET), but not limited herein.

As shown in FIG. 1, a plurality of scan lines GL, a plurality of scan signal lines SGL and a plurality of signal lines XL are disposed on a substrate 100. Each of the signal lines XL may represent a data line or a touch signal line. The touch display device 10 may include a plurality of scan lines GL, a plurality of scan signal lines SGL, a plurality of data lines (e.g., some of the signal lines XL shown in FIG. 1) and a plurality of touch signal lines (e.g., others of the signal lines XL shown in FIG. 1) disposed on the substrate 100.

It should be noted that, in order to simplify the drawing, only one signal line XL is illustrated between two adjacent scan signal lines SGL in FIG. 1, but not limited herein. For example, four signal lines XL may be disposed between two adjacent scan signal lines SGL, and the four signal lines XL may include three data lines and one touch signal line.

The extending direction of the scan signal line SGL in the display region DR is different from the extending direction of the scan line GL in the display region DR. As shown in FIG. 1, the scan line GL extends along a first direction D1 in the display region DR, the scan signal line SGL extends along a second direction D2 in the display region DR, and the first direction D1 is not parallel to the second direction D2. For example, the first direction D1 may be perpendicular to the second direction D2.

The scan signal line SGL may extend from the top side of the display region DR to the bottom side of the display region DR along the second direction D2, and further extend from the bottom side of the display region DR to a gate driving circuit GD in the peripheral region PR. As shown in FIG. 1, each of the scan lines GL is electrically connected to a corresponding scan signal line SGL by a contact X, and each of the scan signal lines SGL is electrically connected to the gate driving circuit GD in the peripheral region PR. Therefore, the gate driving circuit GD may drive pixels electrically connected to the scan lines GL through the scan signal lines SGL.

The structure of the contact X may be a via hole penetrating through at least one insulating layer, the via hole exposes a portion of the scan line GL, and the scan signal line SGL may extend into the via hole to be electrically connected the corresponding scan line GL. In a variant embodiment, the structure of the contact X may be a via hole penetrating at least one insulating layer, the via hole exposes a portion of the scan signal line SGL, and the scan line GL may extend into the via hole to be electrically connected to the corresponding scan signal line SGL. The detail of the above description may be referred to the following embodiments, and the structure of the contact X of the present invention is not limited herein.

In conventional display devices, the scan lines GL extend to the peripheral region PR on the left and right sides of the display region DR along the first direction D1. In some display devices, the scan lines GL may be electrically connected to the gate driving circuits GD in the peripheral region PR on the left and right sides of the display region DR. In other display devices, the scan lines GL may be bent in the peripheral region PR on the left and right sides of the display region DR and extend to the gate driving circuit GD below the display region DR along the second direction D2. Therefore, in conventional display devices, the bent portions of the scan lines GL or the gate driving circuits GD are disposed in the peripheral region PR on the left and right sides of the display regions DR, thus the border widths of the left and right sides of the display device cannot be reduced effectively.

However, in the present invention, since the scan signal lines SGL extending along the second direction D2 are disposed in the display region DR and the gate driving circuit GD is disposed below the display region DR in the second direction D2, the scan lines GL or the gate driving circuit GD is prevented from being disposed in the peripheral region PR on the left and right sides of the display region DR, and the border widths on the left and right sides of the touch display device 10 can be effectively reduced, so as to achieve the narrow-border or no-border design.

In addition, as shown by the signal lines XL in FIG. 1, the data lines and/or the touch signal lines may extend along the second direction D2 in the display region DR, and the extending direction of the scan lines GL in the display region DR is different from the extending direction of the data lines in the display region DR. In the peripheral region PR, the data lines may extend to a source driving circuit SD, and the touch signal lines may extend to a touch sensing circuit TS. Therefore, the pixels in the display region DR may be electrically connected to the source driving circuit SD in the peripheral region PR by the data lines, and the touch electrodes in the display region DR may be electrically connected to the touch sensing circuit TS in the peripheral region PR by the touch signal lines.

Figure 5:
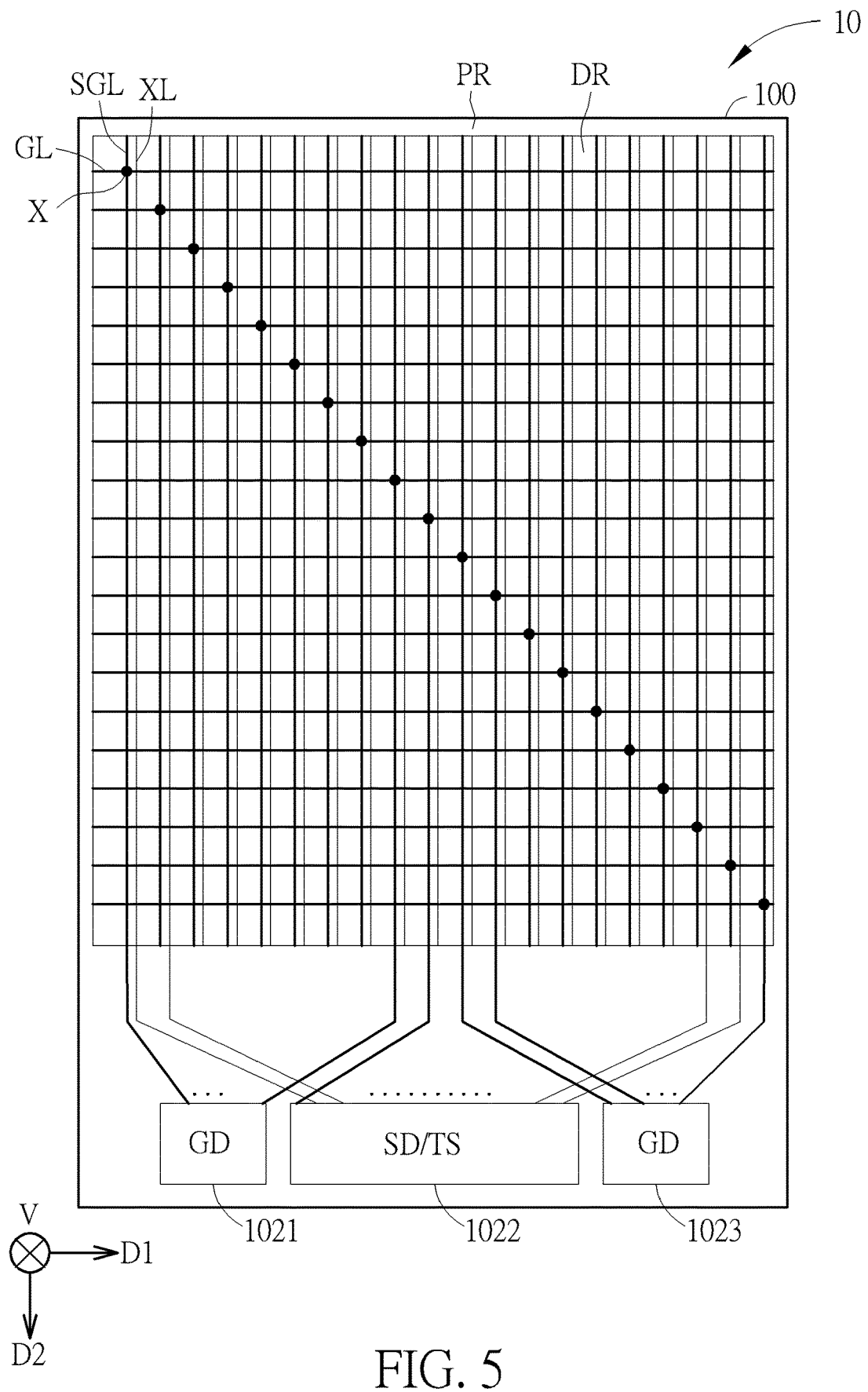
FIG. 5 is a top-view schematic diagram of a touch display device of a variant embodiment of the first embodiment.

As shown in FIG. 1, the gate driving circuit GD, the source driving circuit SD and the touch sensing circuit TS may be integrated into an integrated circuit 102, but not limited herein. Please also refer to FIG. 5, which is a top-view schematic diagram of a touch display device of a variant embodiment of the first embodiment. In this variant embodiment, the touch display device 10 may include an integrated circuit 1021, an integrated circuit 1022 and an integrated circuit 1023, and the integrated circuit 1022 may be disposed between the integrated circuit 1021 and the integrated circuit 1023. Each of the integrated circuit 1021 and the integrated circuit 1023 may include a gate driving circuit GD, and the integrated circuit 1022 may include a source driving circuit SD and a touch sensing circuit TS. The gate driving circuit GD in the integrated circuit 1021 may be electrically connected to a portion of the scan signal lines SGL, and the gate driving circuit GD in the integrated circuit 1023 may be electrically connected to another portion of the scan signal lines SGL. In addition, the source driving circuit SD in the integrated circuit 1022 may be electrically connected to the data lines, and the touch sensing circuit TS in the integrated circuit 1022 may be electrically connected to the touch signal lines, as the signal lines XL shown in FIG. 5.

In some variant embodiments, the touch display device 10 may include four integrated circuits, two of the integrated circuits may include gate driving circuits GD, and each of the other two integrated circuits may include a source driving circuit SD and a touch sensing circuit TS. In other variant embodiments, the touch display device 10 may include more than four integrated circuits.

In FIG. 1, each of the scan signal lines SGL and the signal lines XL extends parallel to the second direction D2 in the display region DR. However, each of the scan signal lines SGL, the data lines and/or the touch signal lines may extend along the second direction D2 in a bent or zigzag manner, which is not limited to the straight extending manner shown in FIG. 1, and may be referred to FIG. 2.

Figure 2:
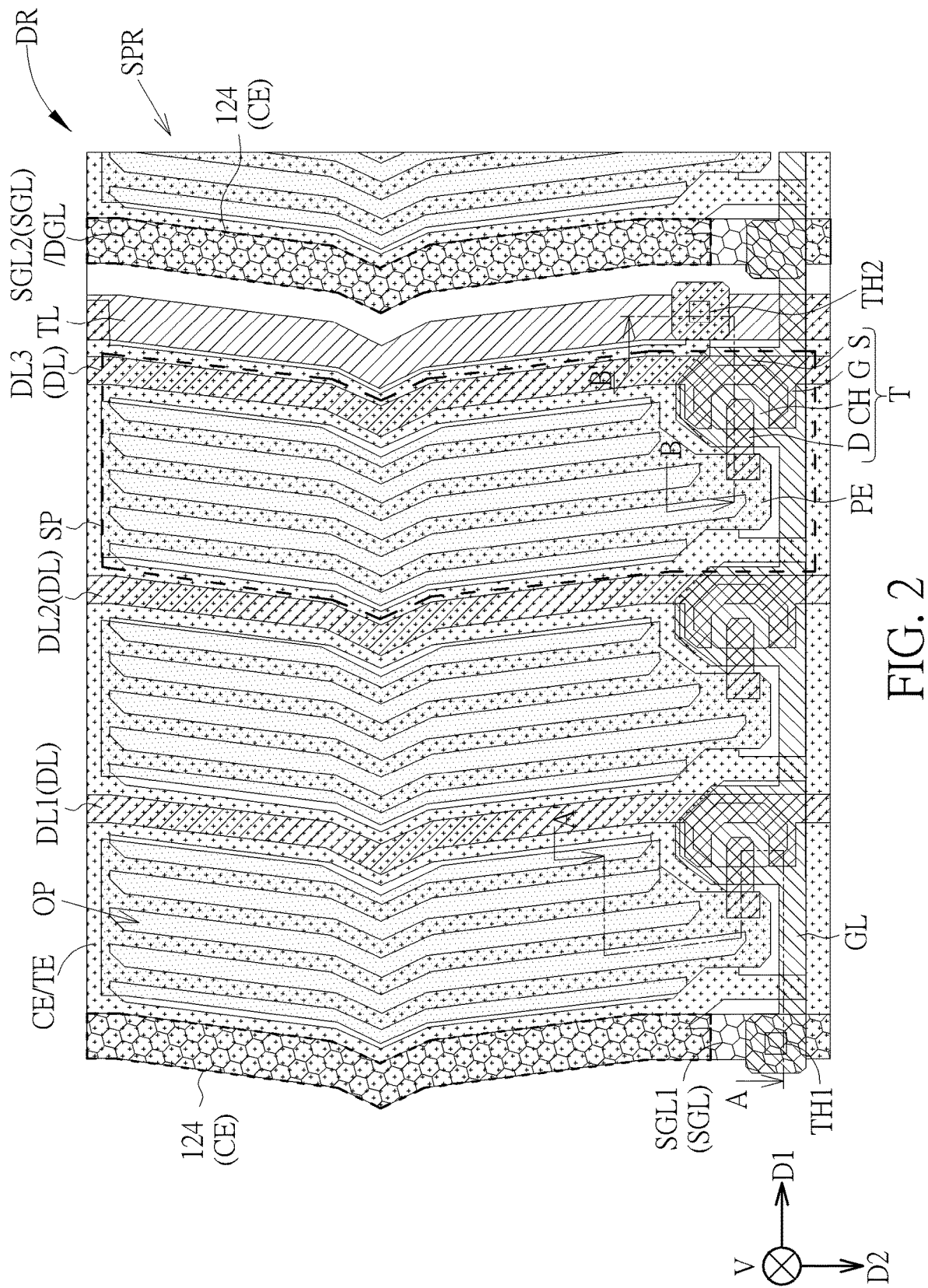
FIG. 2 is a partial top-view schematic diagram of a display region of the touch display device of the first embodiment according to the present invention.

Please refer to FIG. 2, which is a partial top-view schematic diagram of a display region of the touch display device of the first embodiment according to the present invention. In the display region DR, the scan lines GL and the data lines DL can cross with each other to define a plurality of sub-pixels SP. In the sub-pixel row SPR in FIG. 2, the shapes of the left and right sides of the sub-pixel SP are "<". In another sub-pixel row adjacent to the sub-pixel row SPR in the second direction D2, the shapes of the left and right sides of the sub-pixel SP are ">", and the ">" shape sub-pixels SP and the "<" shape sub-pixels SP may be alternately arranged along the second direction D2.

In some embodiments, the top-view of the sub-pixel SP may have a shape similar to a parallelogram, the shapes of the left and right sides of the sub-pixel SP in a sub-pixel row may be "∕", the shapes of the left and right sides of the sub-pixel SP in another sub-pixel row adjacent to the sub-pixel row may be "∖", and the left sides or the right sides of the sub-pixels SP of two adjacent sub-pixel rows are arranged in a "<" shape or a ">" shape in the second direction D2. In other embodiments, the shape of the sub-pixel SP may be a rectangle.

As shown in FIG. 2, in the display region DR, the scan signal lines SGL1-SGL2, the data lines DL1-DL3 and the touch signal line TL are substantially parallel to each other, and each of the scan signal lines SGL1-SGL2, the data lines DL1-DL3 and the touch signal line TL extends along a direction parallel to the left and right sides of the sub-pixels SP. That is to say, the scan signal lines SGL1-SGL2, the data lines DL1-DL3 and the touch signal lines TL in the display region DR may also be zigzag in the second direction D2.

It should be noted that, the signal line labeled with SGL2(SGL)/DGL in FIG. 2 represents that this signal line is served as the scan signal line SGL2 when it is electrically connected to another scan line GL (not shown in FIG. 2) in the display region DR; and this signal line is served as a dummy signal line DGL when it is not electrically connected to any one of the scan lines GL in the display region DR and is electrically isolated (electrically insulated) from each of the scan lines GL in the display region DR. The design of disposing the dummy signal lines DGL can make the aperture ratios of different pixels being substantially equal, thereby improving the display quality of the image. The detail of the above description may be referred to the following embodiments.

In this embodiment, a pixel may include three sub-pixels SP. As shown in FIG. 2, in one pixel, three data lines DL1-DL3 may be disposed between one scan signal line SGL1 and one touch signal line TL, and the data lines DL, the scan signal lines SGL and the touch signal lines TL may be repeatedly arranged along the first direction D1 in the sub-pixel row SPR according to the configuration described above, but not limited herein. Therefore, the touch signal line TL may be disposed between the data line DL3 and the scan signal line SGL2 of the adjacent pixel, or between the data line DL3 and the dummy signal line DGL of the adjacent pixel.

As shown in FIG. 2, the scan signal line SGL1 may be electrically connected to the scan line GL in FIG. 2 through a via hole TH1. In this embodiment, the contact X in FIG. 1 may be the via hole TH1 in FIG. 2. In addition, the scan signal line SGL2 may not be electrically connected to the scan line GL in FIG. 2, and the scan signal line SGL2 may be electrically connected to another scan line GL (not shown in FIG. 2) in the display region DR.

In this embodiment, the touch display device 10 further includes dummy signal lines DGL. Similar to the scan signal line SGL in FIG. 1, the dummy signal line DGL may also extend along the second direction D2 in the display region DR, and the dummy signal line DGL may also extend from the top side of the display region DR to the bottom side of the display region DR along the second direction D2. Therefore, the extending direction of the dummy signal line DGL in the display region DR may be parallel to the extending direction of the scan signal line SGL in the display region DR. As shown in FIG. 2, in the display region DR, the dummy signal line DGL, the scan signal line SGL1, the data lines DL1-DL3 and the touch signal line TL are parallel to each other. In addition, the electric potential of each of the dummy signal lines DGL may be a common voltage, but not limited herein. The electric potential of each of the dummy signal lines DGL may be another fixed voltage, or the dummy signal lines DGL may be floating.

As shown in FIG. 2, each of the sub-pixels SP of the touch display device 10 includes a thin film transistor T. The thin film transistor T of this embodiment may be a bottom-gate thin film transistor, but not limited herein. In other embodiments, the thin film transistor T may be a top-gate thin film transistor. In addition, the thin film transistor T may be a low temperature poly-silicon (LTPS) thin film transistor, an indium gallium zinc oxide (IGZO) thin film transistor or an amorphous silicon (a-Si) thin film transistor, but not limited herein.

The thin film transistors T are disposed on the substrate 100 and in the display region DR, and the thin film transistor T includes a gate a source S, a drain D and a semiconductor layer CH. Each of the scan lines GL is electrically connected to the gate G of at least one thin film transistor T, so as to provide a switch signal to the gate G of the thin film transistor T to turn on or turn off the thin film transistor T. Each of the data lines DL1-DL3 is electrically connected to the source S of at least one thin film transistor T, so as to provide image gray scale signal to the source S of the thin film transistor T.

The touch display device 10 includes a plurality of pixel electrodes PE respectively disposed in the sub-pixels SP, and each of the pixel electrodes PE is electrically connected to the drain D of the corresponding thin film transistor T. In addition, the touch display device 10 includes a plurality of common electrodes CE respectively disposed in the sub-pixels SP, and the common electrodes CE may receive a common voltage during the display period of the touch display device 10. Each of the common electrodes CE may have at least one opening (or may be referred to as at least one slit) OP. The openings OP overlap the pixel electrodes PE in a vertical projection direction V (or may be referred to as a direction V perpendicular to the substrate 100), so that the common electrodes CE and the pixel electrodes PE may generate a fringing electric field to rotate the liquid crystal molecules.

In addition, the touch display device 10 may include a plurality of touch electrodes TE, and each of the touch electrodes TE is formed by electrically connecting the common electrodes CE of the corresponding sub-pixels SP. In other words, one touch electrode TE includes the common electrodes CE of multiple sub-pixels SP. The touch electrodes TE are used to sense the user's touch position during the touch sensing period of the touch display device 10, and receive the common voltage and serve as common electrodes during the display period of the touch display device 10. In addition, each of the touch signal lines TL is electrically connected to a corresponding touch electrode TE to transmit and/or receive touch sensing signals during the touch sensing period of the touch display device 10.

Figure 3:
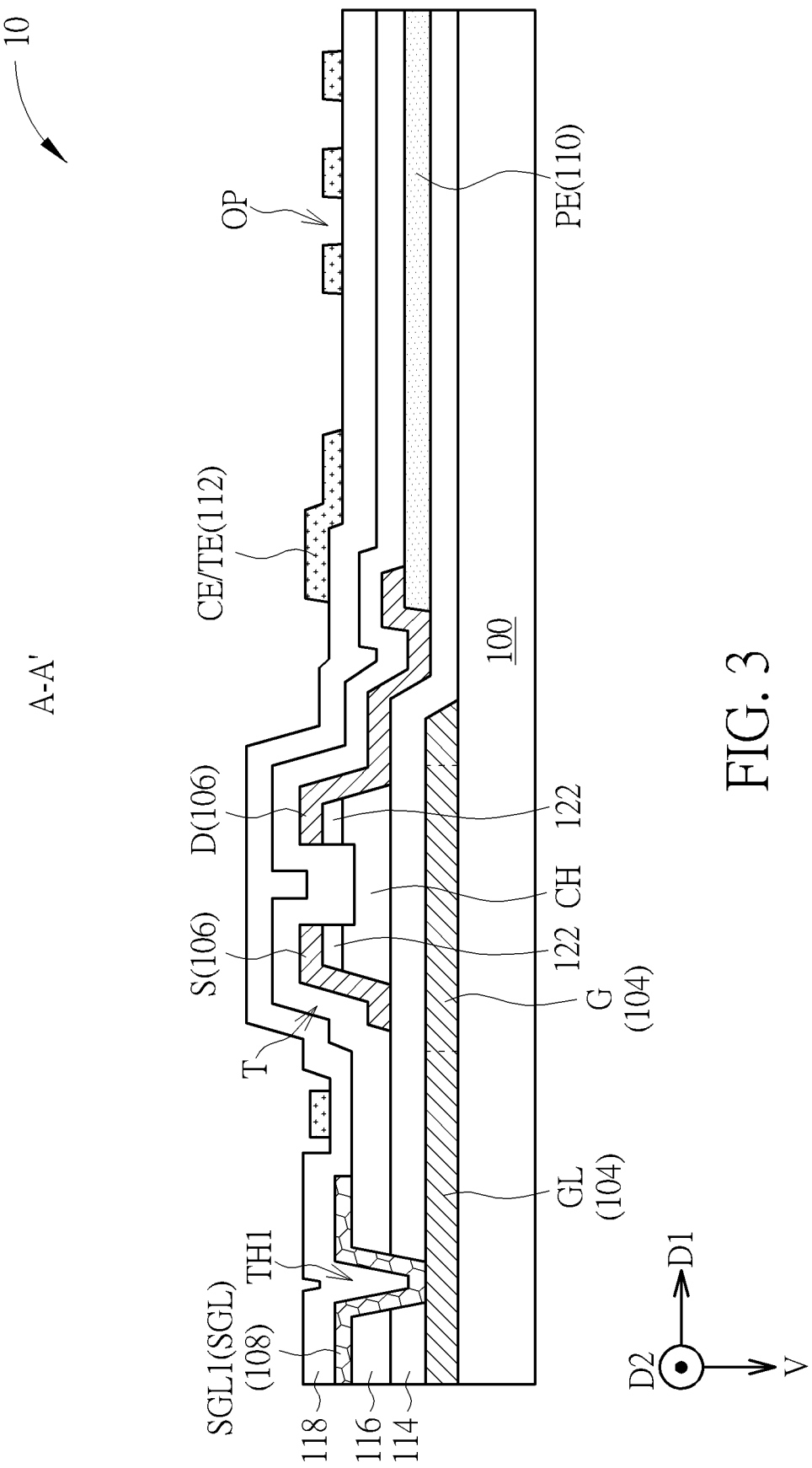
FIG. 3 is a structural sectional-view schematic diagram along the section line A-A' in FIG. 2.
Figure 4:
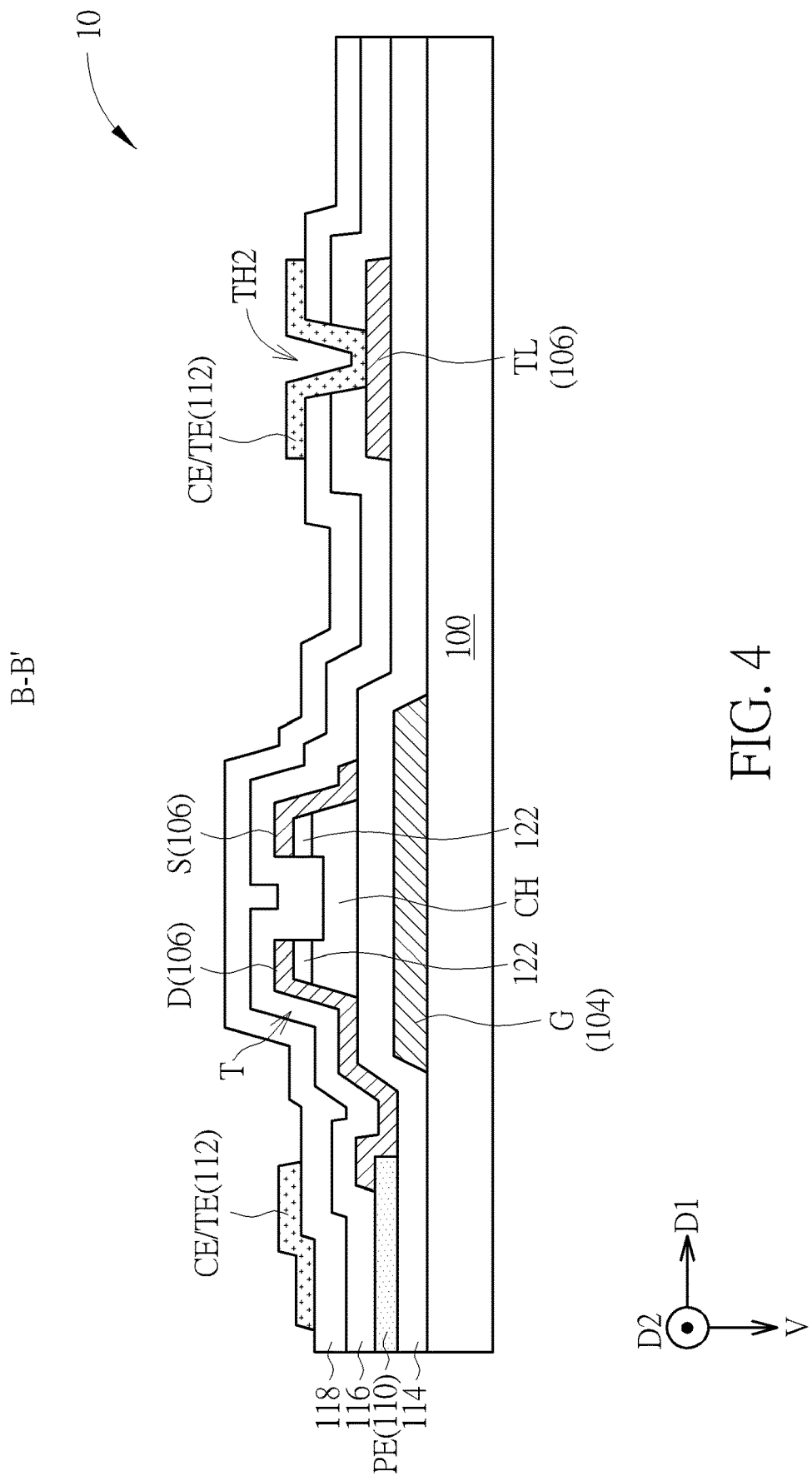
FIG. 4 is a structural sectional-view schematic diagram along the section line B-B' in FIG. 2.

Please refer to FIG. 2 to FIG. 4, FIG. 3 is a structural sectional-view schematic diagram along the section line A-A' in FIG. 2, and FIG. 4 is a structural sectional-view schematic diagram along the section line B-B' in FIG. 2. The touch display device 10 may include a first metal layer 104, a second metal layer 106, a third metal layer 108, a first transparent conductive layer 110, a second transparent conductive layer 112, a first insulating layer 114, a second insulating layer 116 and a third insulating layer 118. The first metal layer 104 is disposed on the substrate 100 and includes the scan line GL and the gate G of the thin film transistor T. The first insulating layer 114 is disposed on the first metal layer 104 and may be served as a gate insulating layer.

The semiconductor layer CH and the first transparent conductive layer 110 are disposed on the first insulating layer 114, and the first transparent conductive layer 110 includes the pixel electrode PE. The semiconductor layer CH may be correspondingly disposed on the gate and the semiconductor layer CH may be amorphous silicon, polysilicon or metal oxide (such as indium gallium zinc oxide), but not limited herein.

The second metal layer 106 is disposed on the first insulating layer 114, and the second metal layer 106 may include the data lines DL, the touch signal line TL, and the source S and the drain D of the thin film transistor T. As shown in FIG. 3 and FIG. 4, the drain D partially covers the pixel electrode PE and directly contacts the pixel electrode PE. In some embodiments, an electrode or a connection line of the second metal layer 106 may be connected to an electrode or a connection line of the first metal layer 104 through a via hole (not shown) penetrating through the first insulating layer 114.

In addition, the thin film transistor T further includes an ohmic contact layer 122 disposed between the source S and the semiconductor layer CH and between the drain D and the semiconductor layer CH. The ohmic contact layer 122 may be N type doped semiconductor layer or P type doped semiconductor layer, but not limited herein.

The second insulating layer 116 and the third insulating layer 118 are disposed on the second metal layer 106 and the first transparent conductive layer 110, and the third insulating layer 118 is disposed on the second insulating layer 116. In addition, the third metal layer 108 is disposed between the second insulating layer 116 and the third insulating layer 118, and the third metal layer 108 includes the scan signal line SGL and the dummy signal line DGL. As shown in FIG. 3, the scan signal line SGL1 of the third metal layer 108 is connected to the scan line GL of the first metal layer 104 through the via hole TH1, wherein the via hole TH1 may penetrate through the first insulating layer 114 and the second insulating layer 116.

The second transparent conductive layer 112 is disposed on the third insulating layer 118, and the second transparent conductive layer 112 includes the common electrode CE, and the touch electrode TE is formed by electrically connecting the common electrodes CE of multiple sub-pixels SP. As shown in FIG. 4, the touch electrode TE of the second transparent conductive layer 112 is connected to the touch signal line TL in the second metal layer 106 through a via hole TH2, wherein the via hole TH2 may penetrate through the second insulating layer 116 and the third insulating layer 118.

As shown in FIG. 2, the common electrode CE of the present embodiment may further partially cover the scan signal line SGL. For example, a portion of the common electrode CE (represented by a dotted line frame labeled with 124 in FIG. 2, FIG. 8, FIG. 11 and FIG. 18) overlaps at least a portion of the scan signal line SGL in the vertical projection direction V. Since the scan signal line SGL has a large voltage variation ($\Delta V = -10V$-$15V$), the electric field generated by the scan signal line SGL can affect the directions of the liquid crystal molecules if the scan signal line SGL is not shielded. Therefore, the scan signal line SGL may be shielded by the common electrode CE partially covering the scan signal line SGL to prevent the liquid crystal molecules from being affected by the electric field generated by the scan signal line SGL in this embodiment.

It should be noted that, the touch display device 10 in FIG. 2 to FIG. 4 and the touch display devices in the following figures only illustrate an array substrate, and a liquid crystal layer and a counter substrate (e.g., a color filter substrate) are omitted. In the vertical projection direction V, the liquid crystal layer and the counter substrate are disposed above the array substrate, and the liquid crystal layer is disposed between the array substrate and the counter substrate.

In other embodiments, the second transparent conductive layer 112 may further include a bridging electrode (not shown). The bridging electrode may be connected to the electrode or the connection line of the first metal layer 104 through a via hole penetrating through the first insulating layer 114, the second insulating layer 116 and the third insulating layer 118, and the bridging electrode may be connected to the electrode or the connection line in the second metal layer 106 through another via hole penetrating through the second insulating layer 116 and the third insulating layer 118, thus the electrode or the signal line of the first metal layer 104 and the electrode or the signal line of the second metal layer 106 may be electrically connected by the bridging electrode. For example, the bridging electrode (as well as the common electrode CE) may be formed by the second transparent conductive layer 112, and the bridging electrode and the common electrode CE are electrically insulated from each other, but not limited herein. In addition, in this embodiment, the scan signal lines SGL and the dummy signal line DGL are formed by the third metal layer 108, and the touch signal lines TL are formed by the second metal layer 106, but not limited herein. In other embodiments, the scan signal lines SGL and the dummy signal line DGL may be formed by the second metal layer 106, and the touch signal lines TL may be formed by the third metal layer 108.

Therefore, as shown in FIG. 2, the data line DL1 (also referred to as a first data line) is electrically connected to the source of one of the thin film transistors T (also referred to as a first thin film transistor) in FIG. 2, the data line DL2

(also referred to as a second data line) is electrically connected to the source of another of the thin film transistors T (also referred to as a second thin film transistor) in FIG. 2, and the data line DL3 (also referred to as a third data line) is electrically connected to the source of the other of the thin film transistors T (also referred to as a third thin film transistor) in FIG. 2. In addition, the scan signal line SGL1 (also referred to as the first scan signal line) is electrically connected to a scan line GL in FIG. 2 (also referred to as a first scan line), the scan signal line SGL2 (also referred to as a second scan signal line) may be electrically connected to another scan line GL (not illustrated, and also referred to as a second scan line). In the display region DR, the scan signal line SGL1, the data line DL1, the data line DL2, the data line DL3, the touch signal line TL and the scan signal line SGL2 are sequentially disposed along the extending direction (e.g., the first direction D1) of the scan line GL.

In addition, the extending direction of the second scan line (not illustrated) in the display region DR is parallel to the extending direction of the first scan line GL in the display region DR, and the extending direction of the scan signal line SGL2 in the display region DR is parallel to the extending direction of the scan signal line SGL1 and different from the extending direction of the second scan line (not illustrated).

Alternatively, as shown in FIG. 2, the scan signal line SGL1, the data line DL1, the data line DL2, the data line DL3, the touch signal line TL and the dummy signal line DGL are sequentially disposed along the extending direction of the scan line GL (e.g. the first direction D1) in the display region DR.

Please refer to FIG. 3 and FIG. 4, the manufacturing method of the touch display device 10 of this embodiment may include the following steps, but the sequence of the steps is not limited to the following description. First, the substrate 100 is provided, and a first mask is used to form the first metal layer 104 on the substrate 100. Then, the first insulating layer 114 is formed on the first metal layer 104. Then, a second mask is used to form the semiconductor layer CH and the ohmic contact layer 122 on the first insulating layer 114. After forming the semiconductor layer CH and the ohmic contact layer 122, a third mask may be selectively used to form via holes each penetrating through the first insulating layer 114, and the electrode or the connection line of the second metal layer 106 formed later may be connected to the electrode or the connection line of the first metal layer 104 through a corresponding one of the via holes. Then, a fourth mask is used to form the first transparent conductive layer 110 on the first insulating layer 114.

Then, a fifth mask is used to form the second metal layer 106 on the first insulating layer 114. The source S in the second metal layer 106 may cover a portion of the ohmic contact layer 122 and a portion of the semiconductor layer CH, and the drain D in the second metal layer 106 may cover another portion of the ohmic contact layer 122 and another portion of the semiconductor layer CH.

Then, the second insulating layer 116 is formed on the second metal layer 106 and the first transparent conductive layer 110, and a sixth mask is used to form the via hole TH1 in the second insulating layer 116 and the first insulating layer 114. Then, a seventh mask is used to form the third metal layer 108 on the second insulating layer 116. As shown in FIG. 3, the scan signal line SGL1 of the third metal layer 108 extends into the via hole TH1 and is connected to the scan line GL of the first metal layer 104.

Then, the third insulating layer 118 is formed on the second insulating layer 116 and the third metal layer 108, and an eighth mask is used to form a via hole TH2 in the third insulating layer 118 and the second insulating layer 116. In this embodiment, the third insulating layer 118 and the second insulating layer 116 may be etched in an etching process to form the via hole TH2. In some embodiments, a portion of the via hole TH2 disposed in the second insulating layer 116 may be formed together in the step of forming the via hole TH1, and the other portion of the via hole TH2 disposed in the third insulating layer 118 may be formed in the step of this etching process.

Then, a ninth mask is used to form the second transparent conductive layer 112 on the third insulating layer 118. As shown in FIG. 4, the touch electrode TE of the second transparent conductive layer 112 extends into the via hole TH2 and is connected to the touch signal line TL in the second metal layer 106. In this embodiment, the touch signal line TL and the scan signal line SGL respectively are formed by different metal layers in the display region DR.

In the above and the following description, a phrase such as "a mask is used to form a metal layer or transparent conductive layer" may be interpreted as forming a metal film or transparent conductive film first, and then patterning the metal film or transparent conductive film by performing exposure (using the mask), development and etching processes on the metal film or transparent conductive film to form the metal layer or the transparent conductive layer, but not limited herein. A phrase such as "a mask is used to form the semiconductor layer and the ohmic contact layer" may be interpreted as forming a semiconductor film and an ohmic contact film first, and then patterning the semiconductor film and the ohmic contact film by performing exposure (using the mask), development and etching processes on the semiconductor film and the ohmic contact film to form the semiconductor layer and the ohmic contact layer, but not limited herein. A phrase such as "a mask is used to form a via hole in at least one insulating layer" may be interpreted as forming a via hole in at least one insulating layer by performing exposure (using the mask), development and etching processes on the at least one insulating layer, but not limited herein. In this embodiment, since the third mask is optional, 8 or 9 masks may be required to manufacture the touch display device 10 of this embodiment.

In the present invention, each of the first metal layer 104, the second metal layer 106, and/or the third metal layer 108 may include a single metal layer such as aluminum, copper, titanium, tungsten, etc., or a composite metal layer such as molybdenum/aluminum/molybdenum, titanium/aluminum/titanium, titanium/copper/titanium, titanium/copper, etc., but not limited herein. Each of the first transparent conductive layer 110 and the second transparent conductive layer 112 may include indium tin oxide (ITO), indium zinc oxide (IZO) or aluminum zinc oxide, AZO), but not limited herein. Each of the first insulating layer 114, the second insulating layer 116, the third insulating layer 118 and/or the fourth insulating layer 120 may include silicon oxide, silicon nitride or silicon oxynitride, but not limited herein.

Figure 6:
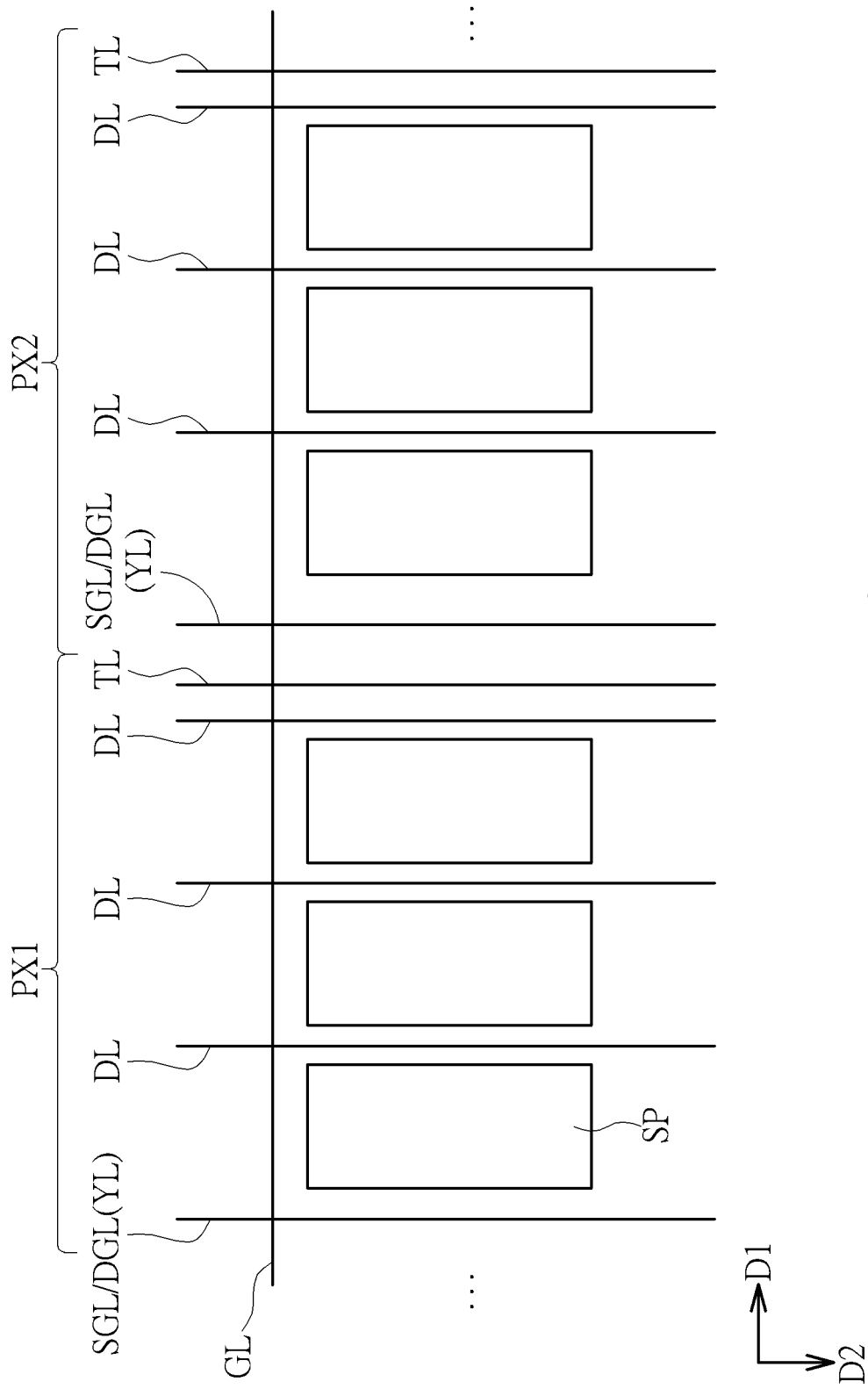
FIG. 6 is a schematic diagram of the configuration of signal lines of the touch display device of the first embodiment according to the present invention.

Please refer to FIG. 6, which is a schematic diagram of the configuration of signal lines of the touch display device of the first embodiment according to the present invention. A Pixel PX1 and a pixel PX2 may be two adjacent pixels in the same pixel row. In this embodiment, a pixel (such as the pixel PX1 or the pixel PX2) may include one scan line GL and three data lines DL. A touch signal line TL may be disposed on one side of each pixel. In addition, the signal line labeled with SGL/DGL (YL) in FIG. 6 represents that a signal line YL may be disposed on the other side of each pixel, and the signal line YL may be a scan signal line SGL or a dummy signal line DGL. When the signal line YL is the scan signal line SGL and is electrically connected to the scan line GL in FIG. 6, a contact X may be illustrated in FIG. 6 at the intersection of the scan signal line SGL and the scan line GL which are electrically connected with each other, so as to represent that the scan signal line SGL and the scan line GL are electrically connected through the contact X.

In FIG. 6, the touch signal line TL and the signal line YL are respectively disposed on the right side and the left side of a pixel, but not limited herein. In some embodiments, the signal line YL and the touch signal line TL may be respectively disposed on the right side and the left side of a pixel. In other embodiments, the signal line YL and the touch signal line TL may both be disposed on the left side of a pixel or may both be disposed on the right side of a pixel. From the above description, a pixel includes a plurality of data lines DL (such as three data lines DL), a touch signal line TL and a signal line YL, and the signal line YL is a scan signal line SGL or a dummy signal line DGL. In this pixel, the signal line YL, the plurality of data lines DL and the touch signal line TL are sequentially disposed along the extending direction of the scan line GL (such as the first direction D1 or the reverse direction of the first direction D1), or the plurality of data lines DL, the touch signal line TL and the signal line YL are sequentially disposed along the extending direction of the scan line GL, or the plurality of data lines DL, the signal line YL and the touch signal line TL are sequentially disposed along the extending direction of the scan line GL.

For example, in this embodiment, the resolution of the touch display device 10 may be 1280×720, the horizontal resolution is 1280, and the vertical resolution is 720, but the horizontal resolution and the vertical resolution of the touch display device 10 of the present invention are not limited herein. Therefore, 720 scan lines GL each extending along the first direction D1 are disposed in the display region DR (as shown in FIG. 1). Since a signal line YL extending along the second direction D2 is disposed in each of the pixels in this embodiment, 1280 signal lines YL are disposed in the display region DR. Among these signal lines YL, 720 signal lines YL are served as scan signal lines SGL and are respectively electrically connected to the 720 scan lines, and the remaining 560 signal lines YL are served as dummy signal lines DGL.

Among the signal lines YL, if the scan signal lines SGL and the dummy signal lines DGL are arbitrarily disposed, for example, the density of the scan signal lines SGL may be higher than the density of the dummy signal lines DGL in some regions of the display region DR, and the density of the dummy signal lines DGL may be higher than the density of the scan signal lines SGL in other regions of the display region DR, the visual effects may be degraded since the scan signal line SGL has a larger voltage variation but the voltage of the dummy signal line DGL is a fixed voltage (e.g., the common voltage). Therefore, the present invention provides a method of distributing the scan signal lines SGL and the dummy signal lines DGL with better visual effects (as described below).

The highest common factor (HCF) of the value of the horizontal resolution "1280" and the number of the dummy signal lines DGL "560" is "80". Therefore, 1280 pixels in a pixel row may be divided into 80 groups, and there are 16 pixels and 16 signal lines YL in each group. Because a number of the scan lines GL is 720 and a number of the groups is 80, therefore, in each group, 9 signal lines YL are electrically connected to nine scan lines GL and served as scan signal lines SGL, and 7 signal lines YL are served as dummy signal lines DGL. Therefore, the scan signal lines SGL and the dummy signal lines DGL are uniformly disposed in the display region DR.

From the above description, the horizontal resolution of the touch display device 10 is M, and the vertical resolution of the touch display device 10 is N, wherein M and N are positive integers, and M is greater than N (i.e., M>N). The number of the pixel columns of the touch display device 10 is equal to the horizontal resolution M, and the number of the scan signal lines SGL is N. Because M is greater than N, therefore, each of N number of pixel columns among the M number of pixel columns is configured with a scan signal line SGL, while each of the remaining (M−N) number of pixel columns among the M number of pixel columns is configured with a dummy signal line DGL. That is to say, the number of the scan signal lines SGL of the touch display device 10 is N, and the number of the dummy signal lines DGL of the touch display device 10 is (M−N).

The method of uniformly distributing the N number of scan signal lines SGL and the (M−N) number of dummy signal lines DGL in the display region DR to improve the display quality of the image is described as follows. The highest common factor of the value of the horizontal resolution (i.e., M) and the number of the dummy signal lines DGL (i.e., (M−N)) is K, the M number of pixel columns may be divided into K number of groups, K is a positive integer greater than or equal to 2, and there are (M/K) pixel columns and (M/K) signal lines YL in each of the K number of groups. In each of the K number of groups, (N/K) number of signal lines YL among the (M/K) signal lines YL are scan signal lines SGL and ((M−N)/K) number of signal lines YL among the (M/K) signal lines YL are dummy signal lines DGL.

Since the number of the pixel columns is equal to the horizontal resolution M, and the number of the scan lines GL is equal to the vertical resolution N, and each of the scan lines GL is electrically connected to a corresponding scan signal line SGL, that is, the number of the scan signal lines SGL is also equal to N, when M is greater than N, each of the pixel columns includes a signal line YL, and the signal line YL is a scan signal line SGL or a dummy signal line DGL. That is to say, as shown in FIG. 6, in a pixel row, a touch signal line TL may be disposed on one side of each pixel, a signal line YL may be disposed on the other side of each pixel, and the signal line YL may be served as a scan signal line SGL or a dummy signal line DGL.

In this embodiment, since the scan signal lines SGL and the dummy signal lines DGL may be uniformly distributed in the display region DR, the display quality of the image may also be improved.

Figure 7:
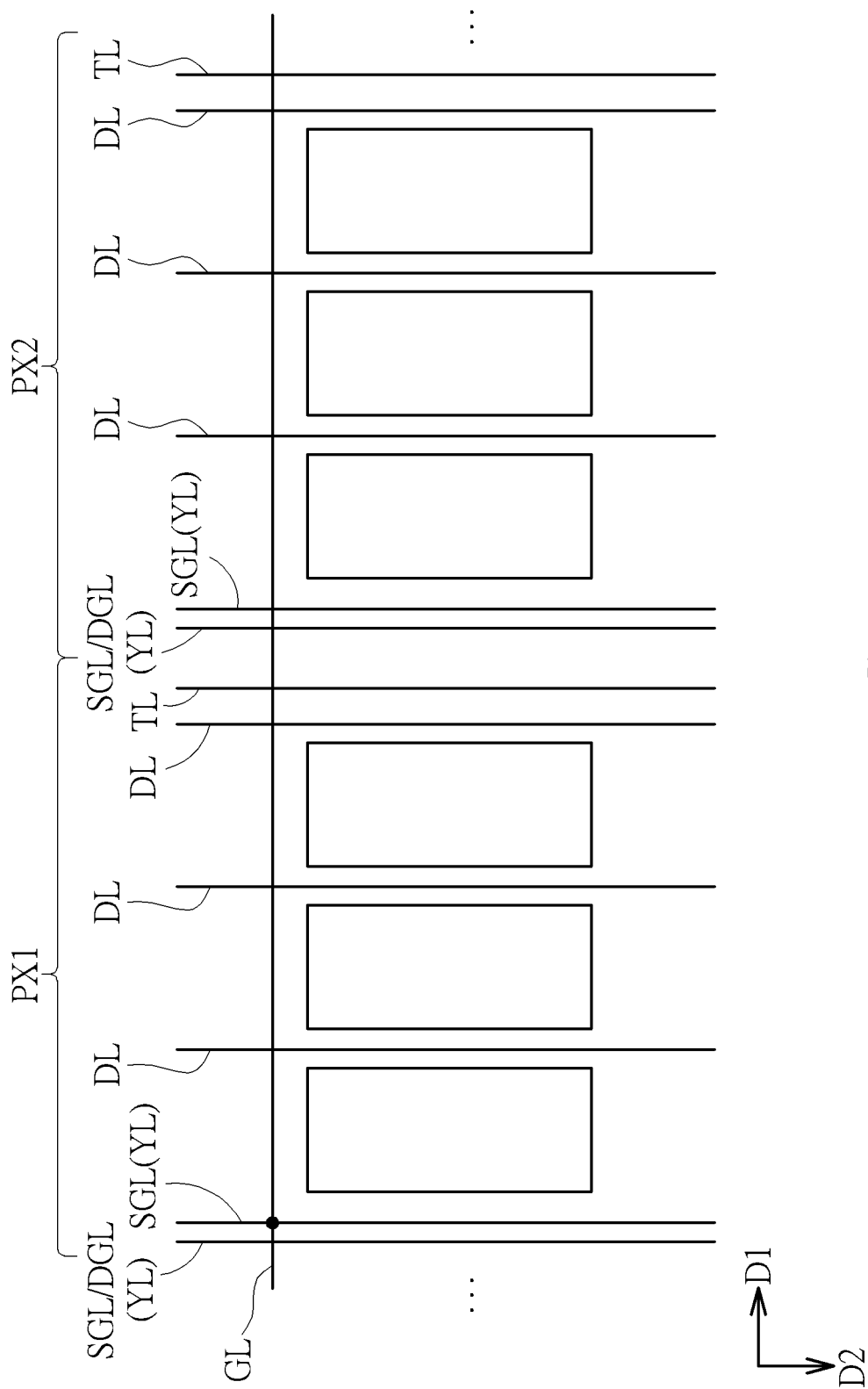
FIG. 7 is a schematic diagram of the configuration of signal lines of a touch display device of a variant embodiment of the first embodiment.

Please refer to FIG. 7, which is a schematic diagram of the configuration of signal lines of a touch display device of a variant embodiment of the first embodiment. In this variant embodiment, a touch signal line TL may be disposed on one side of each pixel, and two signal lines YL may be disposed on the other side of each pixel. The two signal lines YL in each pixel may be a scan signal line SGL and a dummy signal line DGL, or may be two scan signal lines SGL.

In FIG. 7, the touch signal line TL and two signal lines YL are respectively disposed on the right side and the left side of a pixel, but not limited herein. In some embodiments, two signal lines YL and the touch signal line TL may be respectively disposed on the right side and the left side of a pixel. In other embodiments, two signal lines YL and the touch signal line TL may all be disposed on the left side of a pixel or on the right side of a pixel. In still other embodiments, two signal lines YL are respectively disposed on the right side and the left side of a pixel, and the touch signal line TL is disposed on the left side or the right side of this pixel.

From the above description, a pixel includes a plurality of data lines DL (such as three data lines DL), a touch signal line TL and two signal lines YL. In this pixel, two signal lines YL, the data lines DL and the touch signal line TL are sequentially disposed along the extending direction of the scan line GL (such as the first direction D1 or the reverse direction of the first direction D1), or the data lines DL, the touch signal line TL and two signal lines YL are sequentially disposed along the extending direction of the scan line GL, or the data lines DL, two signal lines YL and the touch signal line TL are sequentially disposed along the extending direction of the scan line GL, or one of the signal lines YL, the data lines DL, the other one of the signal lines YL and the touch signal line TL are sequentially disposed along the extending direction of the scan line GL, or one of the signal lines YL, the data lines DL, the touch signal line TL and the other one of the signal lines YL are sequentially disposed along the extending direction of the scan line GL.

For example, in this variant embodiment, the resolution of the touch display device 10 may be 720×1280, wherein the horizontal resolution is 720, and the vertical resolution is 1280. Therefore, 1280 scan lines GL extending along the first direction D1 are disposed in the display region DR (as shown in FIG. 1). Since two signal lines YL each extending along the second direction D2 are disposed in each of the pixels of this embodiment, 1440 (720×2) signal lines YL are disposed in the display region DR. Among these signal lines YL, 1280 signal lines YL are served as the scan signal lines SGL, and the remaining 160 signal lines YL are served as the dummy signal lines DGL. Similarly, the present invention provides a method in which the scan signal lines SGL and the dummy signal lines DGL may be substantially uniformly distributed in the display region DR (as described below), so as to improve the display quality of the image.

The highest common factor of the value of the horizontal resolution "720" and the number of the dummy signal lines DGL "160" is "80". Therefore, 720 pixels in a pixel row may be divided into 80 groups, and there are 9 pixels and 18 signal lines YL in each group, wherein 16 signal lines YL are served as the scan signal lines SGL, and 2 signal lines YL are served as the dummy signal lines DGL.

From the above description, the horizontal resolution of the touch display device 10 is M, and the vertical resolution of the touch display device 10 is N, wherein M and N are positive integers, and M is less than N (i.e., M<N). The number of the pixel columns of the touch display device 10 is equal to the horizontal resolution M, and the number of the scan signal lines SGL is N. Because N is greater than M and less than 2M, therefore, each of (N−M) number of pixel columns among the M number of pixel columns is configured with two scan signal lines SGL, while each of the remaining (M−(N−M))=(2M−N) number of pixel columns among the M number of pixel columns is configured with a scan signal line SGL and a dummy signal line DGL. That is to say, the number of the scan signal lines SGL of the touch display device 10 is N, and the number of the dummy signal lines DGL of the touch display device 10 is (2M−N).

The method of uniformly distributing N scan signal lines SGL and (2M−N) dummy signal lines DGL in the display region DR to improve the display quality of the image is described as follows. The highest common factor of the value of the horizontal resolution (i.e., M) and the number of the dummy signal lines DGL (i.e., (2M−N)) is K, the M number of pixel columns may be divided into K number of groups, and there are (M/K) number of pixel columns and (2(M/K)) number of signal lines YL in each of the groups. In each of the K number of groups, (N/K) number of signal lines YL among the (2M/K) number of signal lines YL are the scan signal lines SGL and ((2M−N)/K) number of signal lines YL among the (2M/K) number of signal lines YL are the dummy signal lines DGL.

Since the number of the pixel columns is equal to the horizontal resolution M, and the number of the scan lines GL is equal to the vertical resolution N, and each of the scan lines GL is electrically connected to a corresponding scan signal line SGL, that is, the number of the scan signal lines SGL is also equal to N, when N is greater than M and less than 2M, each of the pixel columns includes two signal lines YL, and the two signal lines YL are both scan signal lines SGL, or one of the two signal lines YL is a scan signal line SGL and the other one of the two signal lines YL is a dummy signal line DGL. That is to say, as shown in FIG. 7, in a pixel row, a touch signal line TL may be disposed on one side of each pixel, two signal lines YL may be disposed on the other side of each pixel, and the two signal lines YL in each pixel may be a scan signal line SGL and a dummy signal line DGL, or may be two scan signal lines SGL.

In the above description, N is greater than M and less than 2M, but the present invention is not limited herein. Similarly, when N is greater than 2M and less than 3M (e.g., M is 600 and N is 1280), each of (N−2M) number of pixel columns among the M number of pixel columns is configured with three scan signal lines SGL, while each of the remaining (M−(N−2M))=(3M−N) number of pixel columns among the M number of pixel columns is configured with two scan signal lines SGL and a dummy signal line DGL. The method of uniformly distributing N number of scan signal lines SGL and (3M−N) number of dummy signal lines DGL in the display region DR to improve the display quality of the image is described as follows. The highest common factor of the value of the horizontal resolution (i.e., M) and the number of the dummy signal lines DGL (i.e., (3M−N)) is K, the M number of pixel columns may be divided into K number of groups, and there are (M/K) number of pixel columns and (3(M/K)) number of signal lines YL in each of the groups. In each of the K number of groups, (N/K) number of signal lines YL among the (3(M/K)) number of signal lines YL are the scan signal lines SGL and ((3M−N)/K) number of signal lines YL among the (3(M/K)) number of signal lines YL are the dummy signal lines DGL.

When N is greater than 3M and less than 4M, each of (N−3M) number of pixel columns among the M number of pixel columns is configured with four scan signal lines SGL, while each of the remaining (M−(N−3M))=(4M−N) number of pixel columns among the M number of pixel columns is configured with three scan signal lines SGL and a dummy signal line DGL. The method of uniformly distributing N number of scan signal lines SGL and (4M−N) number of dummy signal lines DGL in the display region DR to improve the display quality of the image is described as follows. The highest common factor of the value of the horizontal resolution (i.e., M) and the number of the dummy signal lines DGL (i.e., (4M−N)) is K, the M number of pixel columns may be divided into K number of groups, and there are (M/K) number of pixel columns and (4(M/K)) number of signal lines YL in each of the groups. In each of the K number of groups, (N/K) number of signal lines YL among the (4(M/K)) number of signal lines YL are the scan signal lines SGL and ((4M−N)/K) number of signal lines YL among the (4(M/K)) number of signal lines YL are the dummy signal lines DGL. When N is in other value ranges, the scan signal lines SGL and the dummy signal lines DGL may be arranged according to the above methods, and will not be described redundantly herein.

From the above description, the horizontal resolution of the touch display device 10 is M, and the vertical resolution of the touch display device 10 is N. M and N are positive integers, M is less than N, and N is greater than (J−1)×M and less than or equal to J×M (i.e., M<N, and (J−1)×M<N≤J×M). J is a positive integer greater than or equal to 2, the expression "(J−1)×M" means (J−1) multiplied by M, and the expression "J×M" means J multiplied by M. The number of the pixel columns of the touch display device 10 is equal to the horizontal resolution M, and the number of the scan signal lines SGL is N. Therefore, each of (N−((J−1)×M)) number of pixel columns among the M number of pixel columns is configured with J number of scan signal lines SGL, while each of the remaining (M−(N−((J−1)×M))=((J×M)−N) number of pixel columns among the M number of pixel columns is configured with (J−1) number of scan signal lines SGL and a dummy signal line DGL. That is to say, the number of the scan signal lines SGL of the touch display device 10 is N, and the number of the dummy signal lines DGL of the touch display device 10 is ((J×M)−N).

When N is equal to J×M, the number of the dummy signal lines DGL is 0, and each of the M number of pixel columns is configured with J number of scan signal lines SGL. When N is greater than (J−1)×M and less than J×M, the method of uniformly distributing the N number of scan signal lines SGL and the ((J×M)−N) number of dummy signal lines DGL in the display region DR to improve the display quality of the image is described as follows. The highest common factor of the value of the horizontal resolution (i.e., M) and the number of the dummy signal lines DGL (i.e., (((J×M)−N)) is K, the M number of pixel columns may be divided into K number of groups, and there are (M/K) number of pixel columns and (J×(M/K)) number of signal lines YL in each of the groups, wherein J×(M/K) is J multiplied by (M/K). In each of the K number of groups, (N/K) number of signal lines YL among the (J×(M/K)) number of signal lines YL are the scan signal lines SGL and ((J×M)−N)/K) number of signal lines YL among the (J×(M/K)) number of signal lines YL are the dummy signal lines DGL.

Since the number of the pixel columns is equal to the horizontal resolution M, and the number of the scan lines GL is equal to the vertical resolution N, and each of the scan lines GL is electrically connected to a corresponding scan signal line SGL, that is, the number of the scan signal lines SGL is also equal to N, when N is greater than (J−1)×M and less than or equal to J×M, each of the pixel columns includes J number of signal lines YL, and the J number of signal lines YL are all scan signal lines, or (J−1) number of signal lines YL are the scan signal lines SGL and the remaining one is a dummy signal line DGL among the J number of signal lines YL.

When J is equal to 2, the arrangement of a touch signal line TL and two signal lines YL in a pixel may be referred to the above description of FIG. 7. When J is a positive integer greater than or equal to 3, a touch signal line TL and J number of signal lines YL in a pixel may be respectively disposed on the right side and the left side of the pixel, or may be respectively disposed on the left side and the right side of the pixel, but not limited herein. In some embodiments, a touch signal line TL and the J number of signal lines YL in a pixel may be all disposed on the left side of the pixel or on the right side of the pixel. In other embodiments, L number of signal lines YL and (J−L) number of signal lines YL of the J number of signal lines YL are respectively disposed on the right side and the left side of the pixel, wherein L is a positive integer less than J, and the touch signal line TL is disposed on the left side or the right side of the pixel.

From the above description, a pixel includes a plurality of data lines DL (such as three data lines DL), a touch signal line TL and J number of signal lines YL, wherein J is a positive integer greater than or equal to 2. The J number of signal lines YL are scan signal lines SGL, or (J−1) number of signal lines YL are the scan signal lines SGL and the remaining one is a dummy signal line DGL among the J number of signal lines YL. In this pixel, the J number of signal lines YL, the data lines DL and the touch signal line TL are sequentially disposed along the extending direction of the scan line GL (such as the first direction D1 or the reverse direction of the first direction D1), or the data lines DL, the touch signal line TL and the J number of signal lines YL are sequentially disposed along the extending direction of the scan line GL, or the data lines DL, the J number of signal lines YL and the touch signal line TL are sequentially disposed along the extending direction of the scan line GL, or L number of signal lines YL of the J number of signal lines YL, the data lines DL, (J−L) number of signal lines YL of the J number of signal lines YL and the touch signal line TL are sequentially disposed along the extending direction of the scan line GL, wherein L is a positive integer less than J, or the L number of signal lines YL of the J number of signal lines YL, the data lines DL, the touch signal line TL and the (J−L) number of signal lines YL of the J number of signal lines YL are sequentially disposed along the extending direction of the scan line GL.

In this variant embodiment, since the scan signal lines SGL and the dummy signal lines DGL can be uniformly distributed in the display region DR, the display quality of the image can be improved. In other embodiments, more than two signal lines YL may be disposed in each of the pixels.

The touch display device of the preset invention is not limited to the embodiments describe above. Other embodiments of the present invention will be disclosed in the following. In order to simplify the illustration and clearly show the differences between various embodiments or variations, the same elements in the following would be labeled with the same symbol, and repeated features will not be described redundantly.

Figure 8:
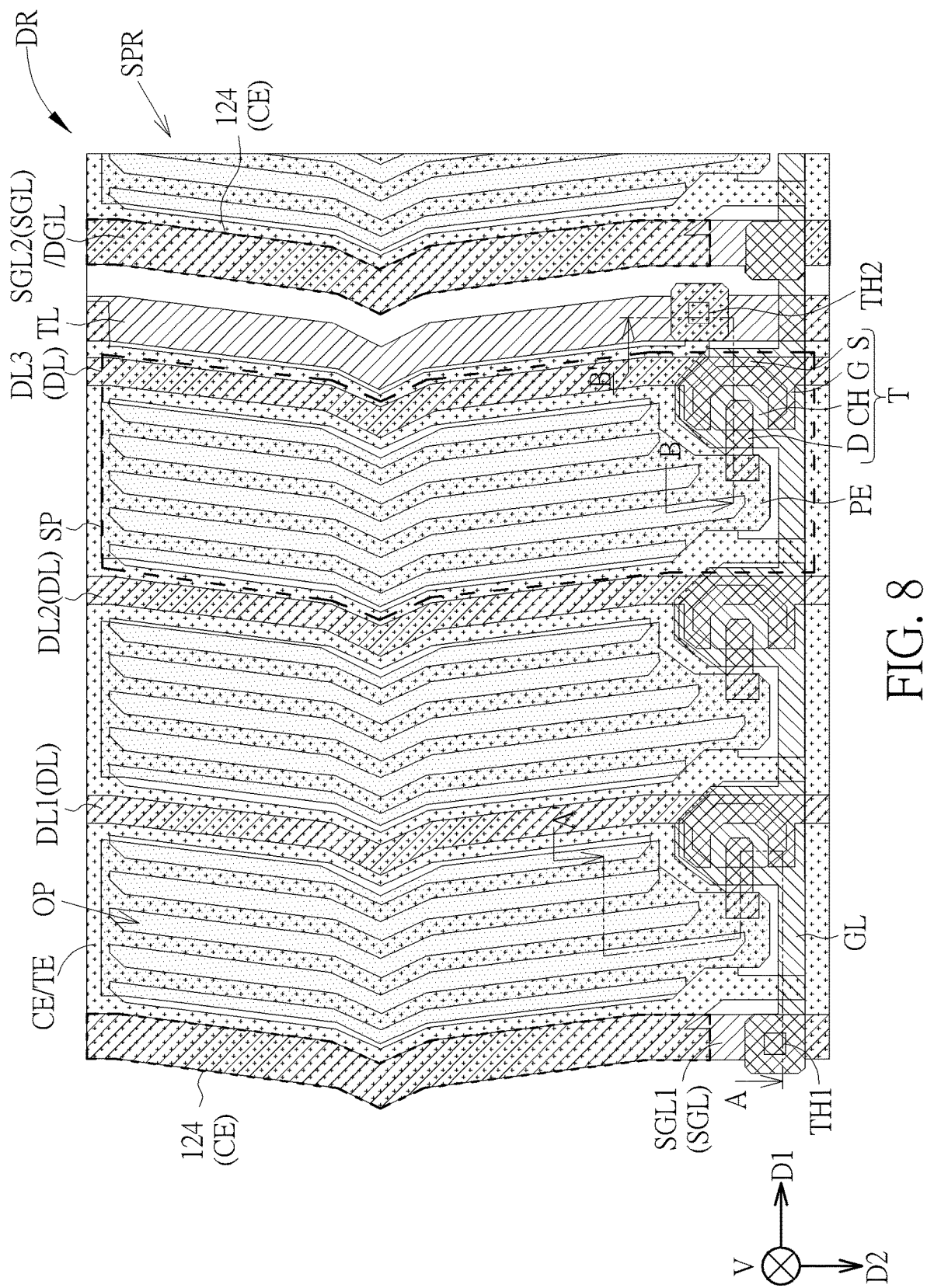
FIG. 8 is a partial top-view schematic diagram of a display region of a touch display device of a second embodiment according to the present invention.
Figure 9:
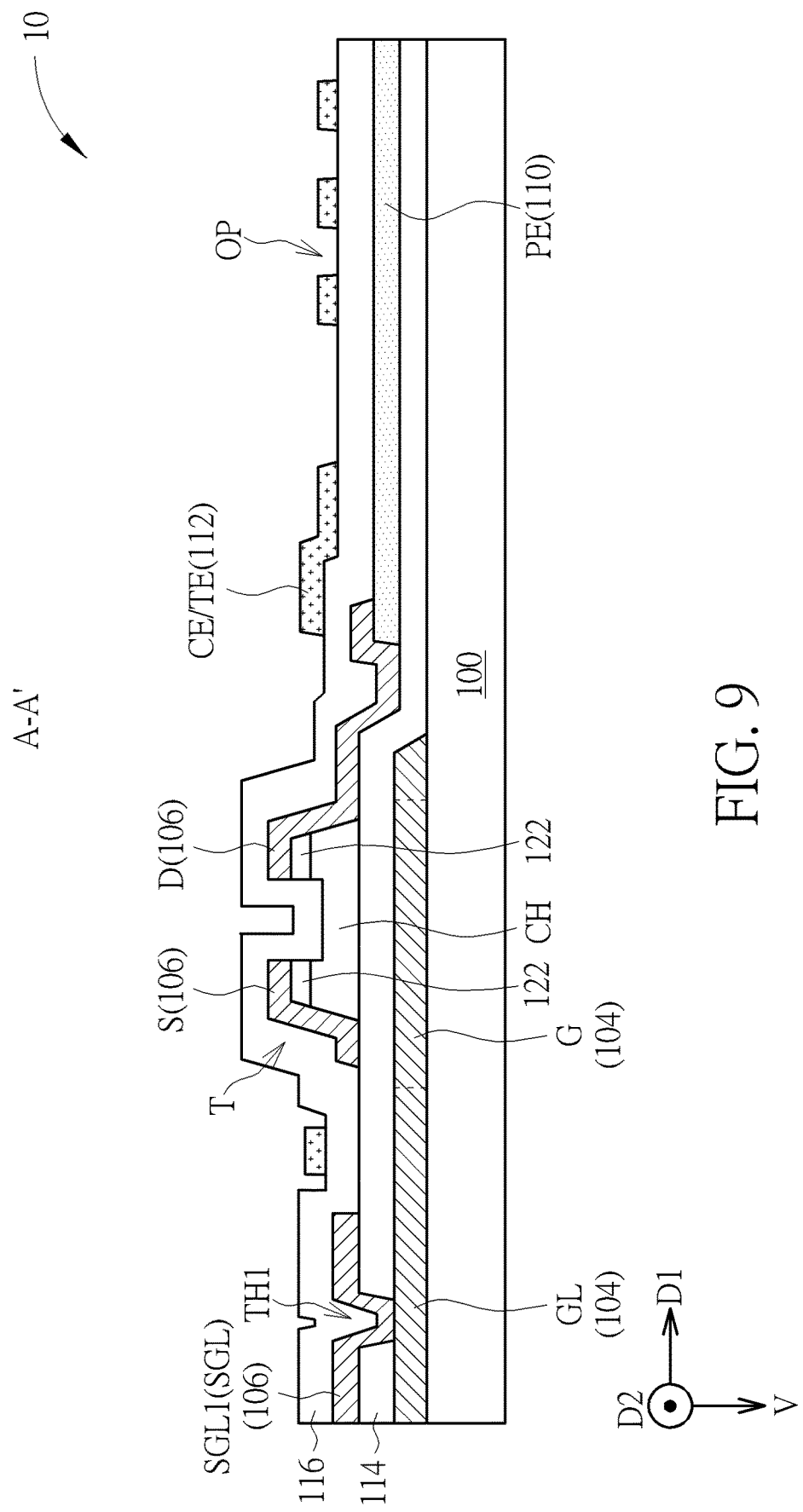
FIG. 9 is a structural sectional-view schematic diagram along the section line A-A' in FIG. 8.
Figure 10:
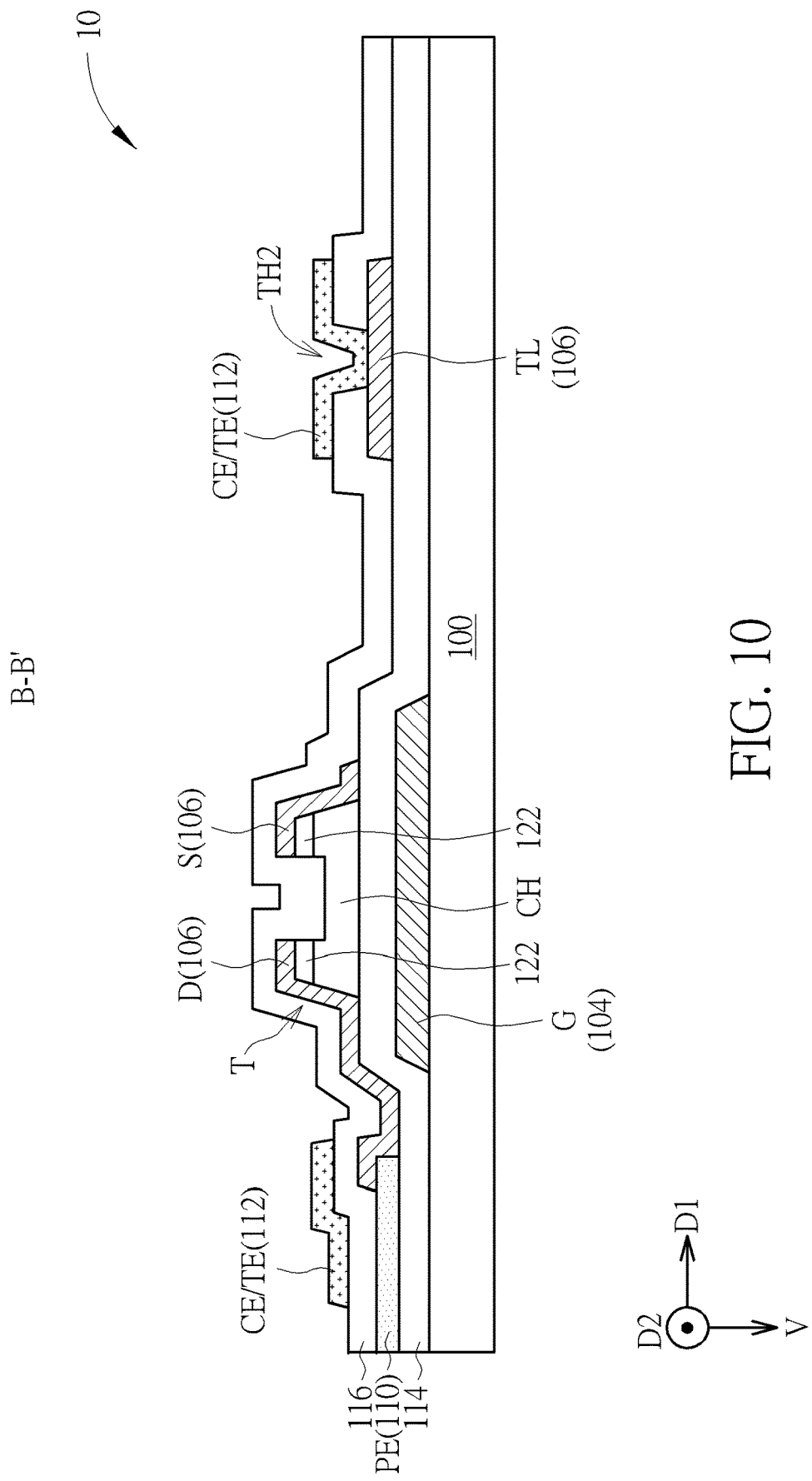
FIG. 10 is a structural sectional-view schematic diagram along the section line B-B' in FIG. 8.

Please refer to FIG. 8 to FIG. 10, FIG. 8 is a partial top-view schematic diagram of a display region of a touch display device of a second embodiment according to the present invention, FIG. 9 is a structural sectional-view schematic diagram along the section line A-A' in FIG. 8, and FIG. 10 is a structural sectional-view schematic diagram along the section line B-B' in FIG. 8. The difference between this embodiment and the first embodiment is that the second metal layer 106 of this embodiment further includes the scan signal lines SGL and the dummy signal lines DGL, and the touch signal lines TL and the scan signal line SGL are formed by the same metal layer in the display region DR. The touch display device 10 of this embodiment does not include the third metal layer 108 and the third insulating layer 118 in the first embodiment, thus the process steps may be omitted to save costs.

As shown in FIG. 9, the scan signal line SGL of the second metal layer 106 is connected to the scan line GL in the first metal layer 104 through the via hole TH1, wherein the via hole TH1 of this embodiment penetrates through the first insulating layer 114. In addition, the second transparent conductive layer 112 of this embodiment is disposed on the second insulating layer 116. As shown in FIG. 10, the touch electrode TE in the second transparent conductive layer 112 is connected to the touch signal line TL of the second metal layer 106 through the via hole TH2, wherein the via hole TH2 of this embodiment penetrates through the second insulating layer 116.

Please refer to FIG. 9 and FIG. 10, the manufacturing method of the touch display device 10 of this embodiment may include the following steps, but the sequence of the steps is not limited to the following description. First, the substrate 100 is provided, and a first mask is used to form the first metal layer 104 on the substrate 100. Then, the first insulating layer 114 is formed on the first metal layer 104. Then, a second mask is used to form the semiconductor layer CH and the ohmic contact layer 122 on the first insulating layer 114. After forming the semiconductor layer CH and the ohmic contact layer 122, a third mask is used to form a via hole TH1 in the first insulating layer 114. Then, a fourth mask is used to form the first transparent conductive layer 110 on the first insulating layer 114. In other embodiments, the first transparent conductive layer 110 may be formed on the first insulating layer 114 first, and then the via hole TH1 is formed in the first insulating layer 114. Then, a fifth mask is used to form the second metal layer 106 on the first insulating layer 114. As shown in FIG. 9, the scan signal line SGL1 of the second metal layer 106 extends into the via hole TH1 and is connected to the scan line GL in the first metal layer 104.

Then, the second insulating layer 116 is formed on the second metal layer 106 and the first transparent conductive layer 110, and a sixth mask is used to form the via hole TH2 in the second insulating layer 116. Then, a seventh mask is used to form the second transparent conductive layer 112 on the second insulating layer 116. As shown in FIG. 10, the touch electrode TE of the second transparent conductive layer 112 extends into the via hole TH2 and is connected to the touch signal line TL of the second metal layer 106, and the touch electrode TE includes the common electrodes CE of multiple sub-pixels SP electrically connected with each other. As shown in FIG. 8, the common electrode CE of this embodiment may also partially cover the scan signal line SGL, so as to prevent the liquid crystal molecules from being affected by the electrical field generated by the scan signal line SGL. In addition, other features of this embodiment may be the same as those of the first embodiment. Therefore, seven masks are required to manufacture the touch display device 10 of this embodiment.

Figure 11:
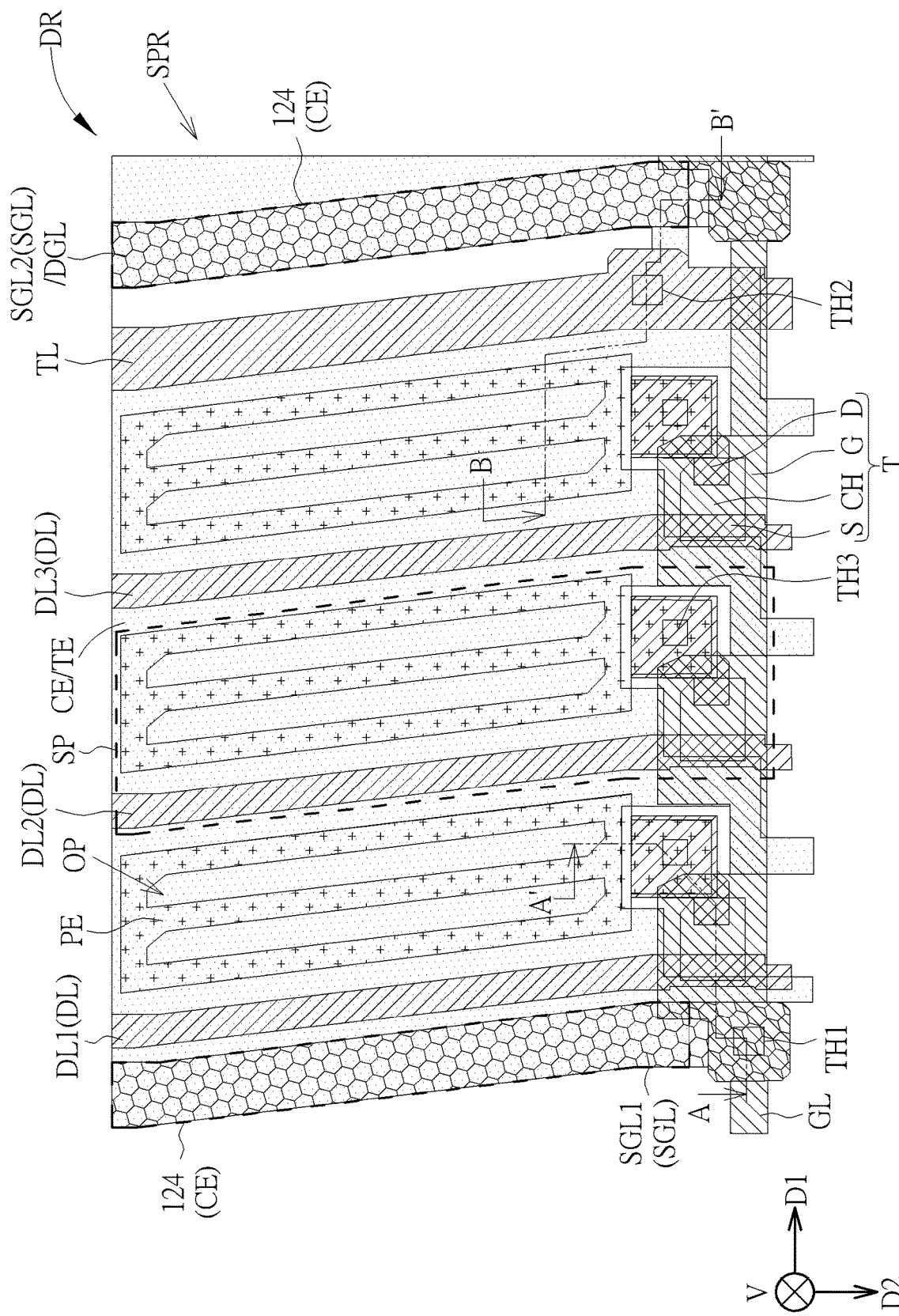
FIG. 11 is a partial top-view schematic diagram of a display region of a touch display device of a third embodiment according to the present invention.
Figure 12:
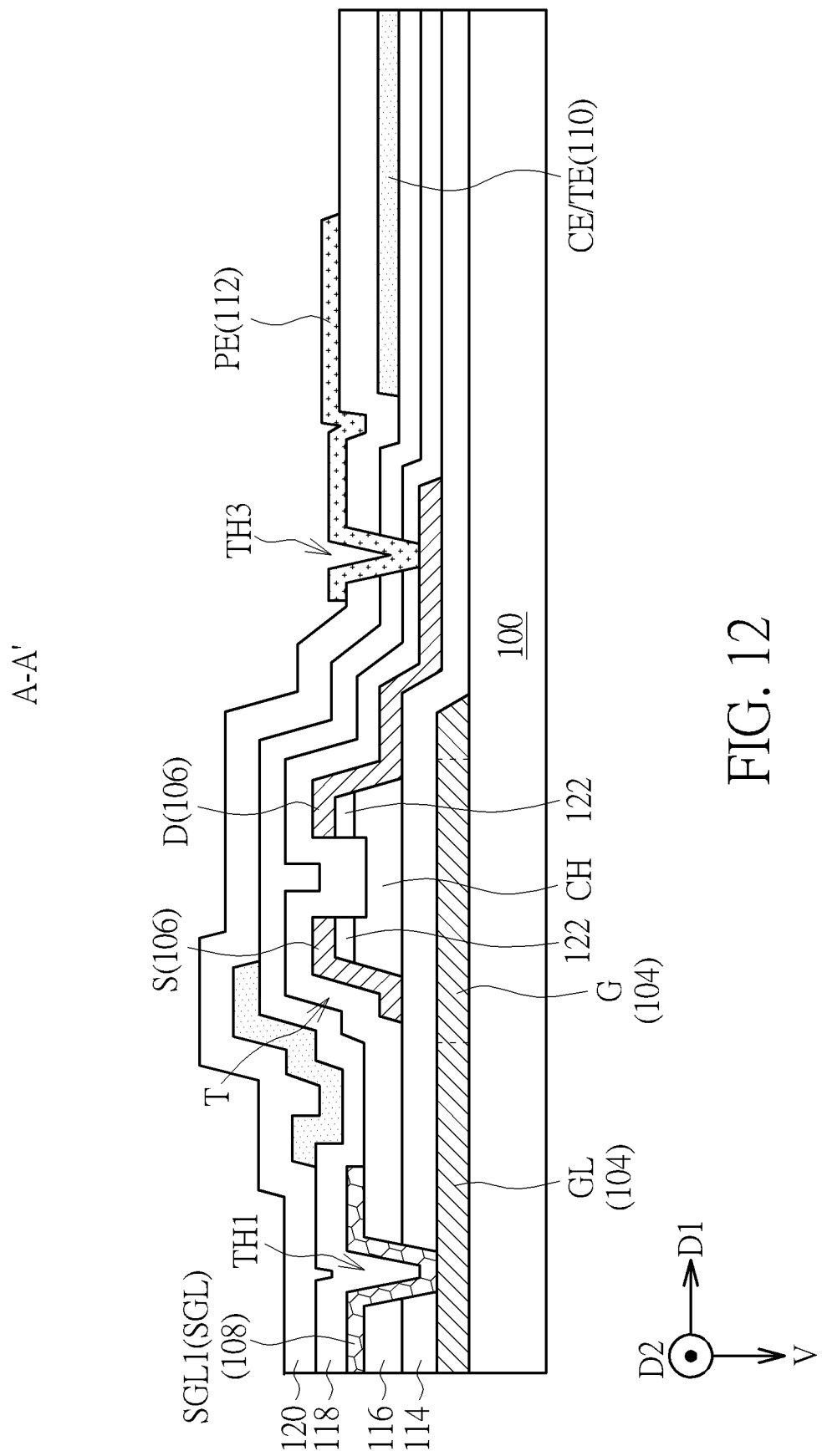
FIG. 12 is a structural sectional-view schematic diagram along the section line A-A' in FIG. 11.
Figure 13:
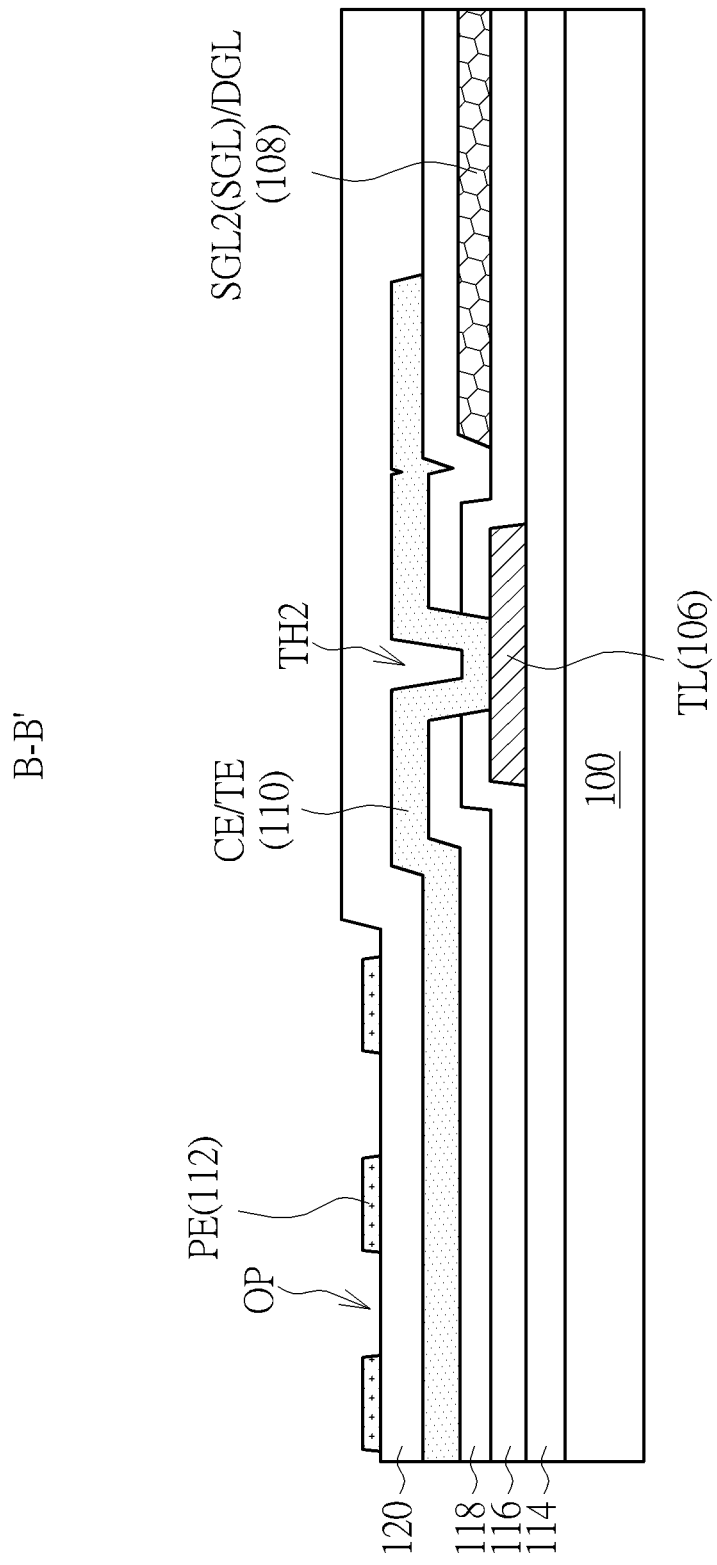
FIG. 13 is a structural sectional-view schematic diagram along the section line B-B' in FIG. 11.

Please refer to FIG. 11 to FIG. 13, FIG. 11 is a partial top-view schematic diagram of a display region of a touch display device of a third embodiment according to the present invention, FIG. 12 is a structural sectional-view schematic diagram along the section line A-A' in FIG. 11, and FIG. 13 is a structural sectional-view schematic diagram along the section line B-B' in FIG. 11. As shown in FIG. 11, the top-view of the sub-pixel SP of this embodiment may be a shape similar to a parallelogram. As shown in FIG. 12, the touch display device 10 of this embodiment may include the first metal layer 104, the second metal layer 106, the third metal layer 108, the first transparent conductive layer 110, the second transparent conductive layer 112, the first insulating layer 114, the second insulating layer 116, the third insulating layer 118 and a fourth insulating layer 120.

As shown in FIG. 11 to FIG. 13, the first metal layer 104 is disposed on the substrate 100 and includes the scan line GL and the gate G of the thin film transistor T. The first insulating layer 114 is disposed on the first metal layer 104. The semiconductor layer CH and the ohmic contact layer 122 are disposed on the first insulating layer 114. The second metal layer 106 is disposed on the first insulating layer 114, and the second metal layer 106 may include the data line DL (as shown in FIG. 11), the touch signal line TL, and the source S and the drain D of the thin film transistor T. The second insulating layer 116 is disposed on the second metal layer 106. A third metal layer 108 is disposed on the second insulating layer 116, and the third metal layer 108 includes the scan signal line SGL and the dummy signal line DGL. As shown in FIG. 12, the scan signal line SGL of the third metal layer 108 is connected to the scan line GL in the first metal layer 104 through the via hole TH1, wherein the via hole TH1 may penetrate through the first insulating layer 114 and the second insulating layer 116.

The third insulating layer 118 is disposed on the third metal layer 108, and the first transparent conductive layer 110 is disposed on the third insulating layer 118. The first transparent conductive layer 110 of this embodiment includes the common electrodes CE, and each of the touch electrodes TE includes the common electrodes CE of multiple sub-pixels SP electrically connected with each other. As shown in FIG. 13, the touch electrode TE in the first transparent conductive layer 110 is connected to the touch signal line TL of the second metal layer 106 through the via hole TH2, wherein the via hole TH2 may penetrate through the second insulating layer 116 and the third insulating layer 118.

The fourth insulating layer 120 is disposed on the first transparent conductive layer 110, and the second transparent conductive layer 112 is disposed on the fourth insulating layer 120. The second transparent conductive layer 112 includes the pixel electrode PE, and the pixel electrode PE is electrically connected to the drain D of the thin film transistor T. As shown in FIG. 12, the pixel electrode PE of the second transparent conductive layer 112 is connected to the drain D of the second metal layer 106 through a via hole TH3, wherein the via hole TH3 may penetrate through the second insulating layer 116, the third insulating layer 118 and the fourth insulating layer 120. In this embodiment, the pixel electrode PE may have at least one opening OP, and the opening OP overlaps the common electrode CE in the vertical projection direction V.

In this embodiment, the scan signal line SGL is formed by the third metal layer 108, the common electrode CE is formed by the first transparent conductive layer 110, and the first transparent conductive layer 110 is formed after forming the third metal layer 108. Therefore, as shown in FIG. 11, the first transparent conductive layer 110 of this embodiment may further partially cover the scan signal line SGL. For example, a portion of the common electrode CE overlaps at least a portion of the scan signal line SGL in the vertical projection direction V, so as to prevent the liquid crystal molecules from being affected by the electrical field generated by the scan signal line SGL.

Please refer to FIG. 12 and FIG. 13, the manufacturing method of the touch display device 10 of this embodiment may include the following steps, but the sequence of the steps is not limited to the following description. First, the substrate 100 is provided, and a first mask is used to form the first metal layer 104 on the substrate 100. Then, the first insulating layer 114 is formed on the first metal layer 104. Then, a second mask is used to form the semiconductor layer CH and the ohmic contact layer 122 on the first insulating layer 114. After forming the semiconductor layer CH and the ohmic contact layer 122, a third mask may be selectively used to form via holes in the first insulating layer 114, and the electrode or the connection line of the second metal layer 106 formed later may be connected to the electrode or the connection line of the first metal layer 104 through a corresponding one of the via holes.

Then, a fourth mask is used to form the second metal layer 106 on the first insulating layer 114. The source S of the second metal layer 106 may cover a portion of an ohmic contact layer 122 and a portion of the semiconductor layer CH, and the drain D of the second metal layer 106 may cover another portion of the ohmic contact layer 122 and another portion of the semiconductor layer CH.

Then, the second insulating layer 116 is formed on the second metal layer 106, and a fifth mask is used to form the via hole TH1 in the second insulating layer 116 and the first insulating layer 114. Then, a sixth mask is used to form the third metal layer 108 on the second insulating layer 116. As shown in FIG. 12, the scan signal line SGL1 of the third metal layer 108 extends into the via hole TH1 and is connected to the scan line GL of the first metal layer 104.

Then, the third insulating layer 118 is formed on the third metal layer 108, and a seventh mask is used to form the via hole TH2 in the third insulating layer 118 and the second insulating layer 116. In this embodiment, the third insulating layer 118 and the second insulating layer 116 may be etched in an etching process to form the via hole TH2. In addition, in some embodiments, a portion of the via hole TH2 disposed in the second insulating layer 116 may be formed together in the step of forming the via hole TH1, and the other portion of the via hole TH2 disposed in the third insulating layer 118 may be formed in the step of this etching process.

Then, an eighth mask is used to form the first transparent conductive layer 110 on the third insulating layer 118. As shown in FIG. 13, the touch electrode TE of the first transparent conductive layer 110 extends into the via hole TH2 and is connected to the touch signal line TL in the second metal layer 106.

Then, the fourth insulating layer 120 is formed on the first transparent conductive layer 110, and a ninth mask is used to form the via hole TH3 in the fourth insulating layer 120, the third insulating layer 118 and the second insulating layer 116. In this embodiment, the fourth insulating layer 120, the third insulating layer 118 and the second insulating layer 116 may be etched in an etching process to form the via hole TH3. In addition, in some embodiments, a portion of the via hole TH3 disposed in the third insulating layer 118 and the second insulating layer 116 may be formed together in at least one of the step of forming the via hole TH1 and the step of forming the via hole TH2, and the other portion of the via hole TH3 disposed in the fourth insulating layer 120 may be formed in this etching process.

Then, a tenth mask is used to form the second transparent conductive layer 112 on the fourth insulating layer 120. As shown in FIG. 12, the pixel electrode PE of the second transparent conductive layer 112 extends into the via hole TH3 and is connected to the drain D in the second metal layer 106. In this embodiment, since the third mask is optional, 9 or 10 masks are required to manufacture the touch display device 10 of this embodiment.

In this embodiment, the scan signal lines SGL are formed by the third metal layer 108, the pixel electrodes PE are formed by the second transparent conductive layer 112, and the third insulating layer 118 and the fourth insulating layer 120 are disposed between the scan signal line SGL and the pixel electrode PE, thereby reducing the capacitive coupling between the scan signal lines SGL and the pixel electrodes PE.

Figure 14:
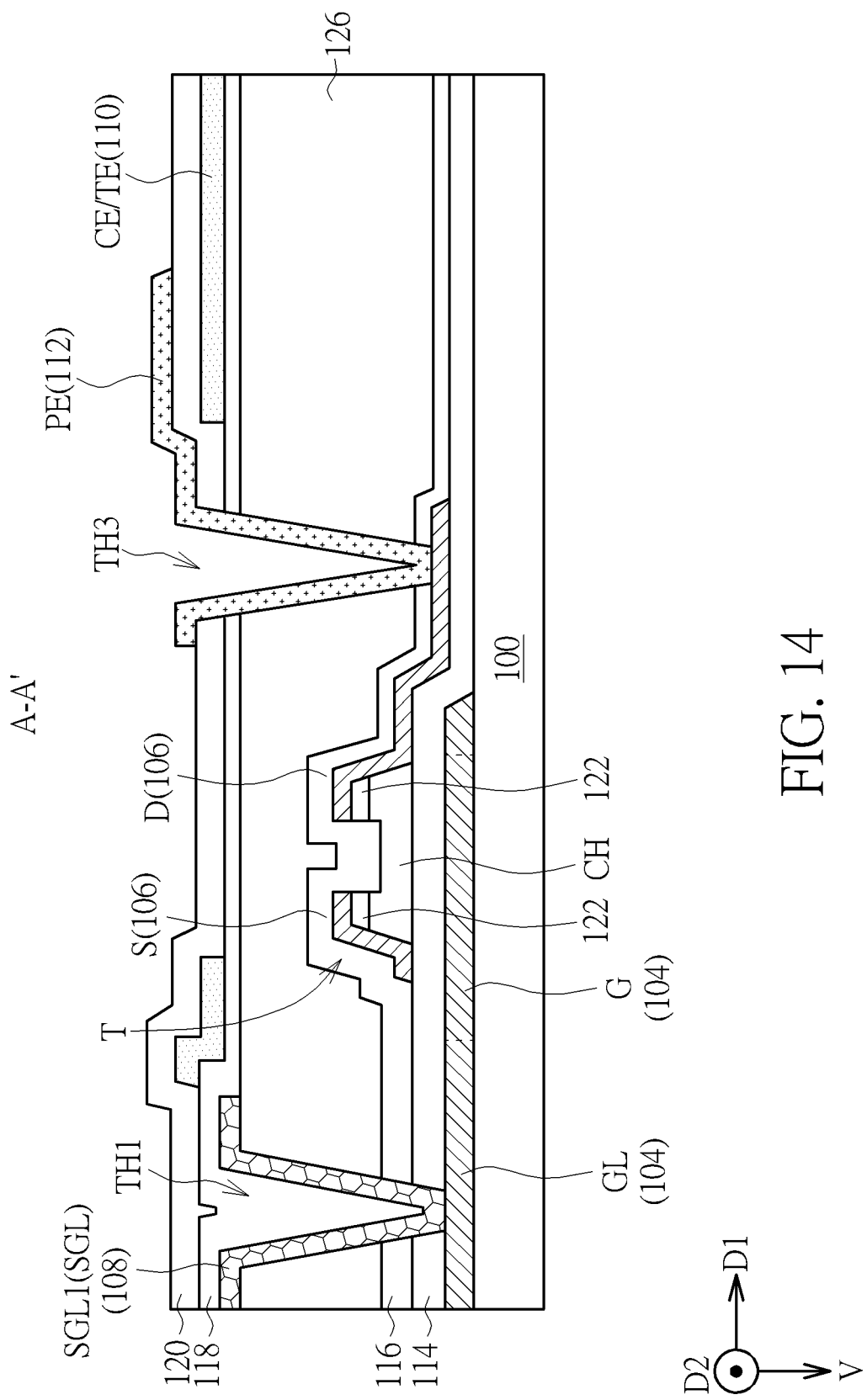
FIG. 14 is a structural sectional-view schematic diagram of a first variant embodiment of the third embodiment.
Figure 15:
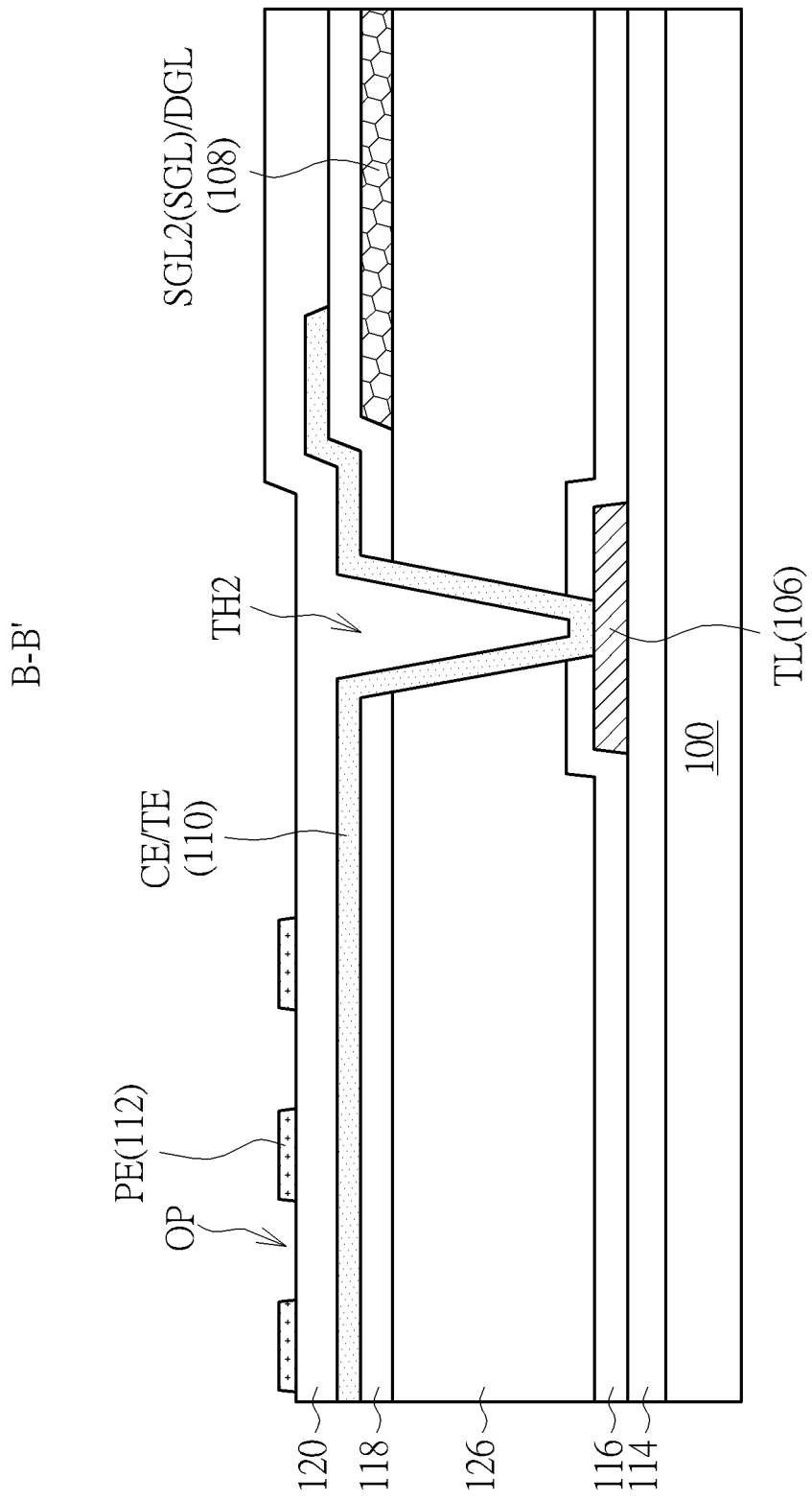
FIG. 15 is another structural sectional-view schematic diagram of the first variant embodiment of the third embodiment.

Please refer to FIG. 14 and FIG. 15, FIG. 14 is a structural sectional-view schematic diagram of a first variant embodiment of the third embodiment, and FIG. 15 is another structural sectional-view schematic diagram of the first variant embodiment of the third embodiment. The partial top-view schematic diagram of a display region of a touch display device of the first variant embodiment of the third embodiment may refer to FIG. 11. The difference between the first variant embodiment and the third embodiment is that after forming the second insulating layer 116 and before forming the third metal layer 108, a fifth insulating layer 126 may be formed on the second insulating layer 116, and the fifth insulating layer 126 is disposed between the second insulating layer 116 and the third metal layer 108.

The via hole TH1 may penetrate through the first insulating layer 114, the second insulating layer 116 and the fifth insulating layer 126, and the via hole TH2 may penetrate through the second insulating layer 116, the fifth insulating layer 126 and the third insulating layer 118, and the via hole TH3 may penetrate through the second insulating layer 116, the fifth insulating layer 126, the third insulating layer 118 and the fourth insulating layer 120. In the third embodiment, the second insulating layer 116 is disposed between the second metal layer 106 and the third metal layer 108. However, in this variant embodiment, the second insulating layer 116 and the fifth insulating layer 126 are disposed between the second metal layer 106 and the third metal layer 108, and therefore the third metal layer 108 of this first variant embodiment may be further away from the second metal layer 106.

Through the technical features described above, the second insulating layer 116 and the fifth insulating layer 126 may be disposed between the adjacent scan signal line SGL and data line DL. For example, the second insulating layer 116 and the fifth insulating layer 126 are disposed between the scan signal line SGL1 and the data line DL1 in FIG. 11, and are also disposed between the scan signal line SGL1 and the source S in FIG. 14. Therefore, the distance between the scan signal line SGL and the data line DL is increased, and the interference between the signal of the scan signal line SGL and the signal of the data line DL is reduced.

In this variant embodiment, the fifth insulating layer 126 may also be served as a planarization layer to planarize the uneven upper surface of the second insulating layer 116. For example, the fifth insulating layer 126 may include an organic material and formed by a coating method (e.g., spin coating or slit coating), but the material and the forming method of the fifth insulating layer 126 are not limited herein. In addition, the thickness of the fifth insulating layer 126 may be greater than the thickness of any one of the first insulating layer 114, the second insulating layer 116, the third insulating layer 118 and the fourth insulating layer 120, so as to increase the distance between the scan signal line SGL and the data line DL and also planarize the surface. For example, the thickness of the fifth insulating layer 126 may be in a range from 1 micrometer to 5 micrometers, but not limited herein.

The difference between the manufacturing method of the touch display device of this first variant embodiment and the manufacturing method of the touch display device of the third embodiment is that the second insulating layer 116 is formed on the second metal layer 106, and a fifth mask is used to form a portion of the via hole TH1 in the second insulating layer 116 and the first insulating layer 114 in this first variant embodiment. Then, a fifth insulating layer 126 is formed on the second insulating layer 116, and another mask is used to form the other portion of the via hole TH1 in the fifth insulating layer 126, a portion of the via hole TH2 in the fifth insulating layer 126 and a portion of the via hole TH3 in the fifth insulating layer 126.

Then, a sixth mask is used to form the third metal layer 108 on the fifth insulating layer 126. As shown in FIG. 14, the scan signal line SGL1 of the third metal layer 108 extends into the via hole TH1 and is connected to the scan line GL of the first metal layer 104. Other features of this first variant embodiment are similar to the third embodiment, and will not be described redundantly herein. In this embodiment, the fifth insulating layer 126 may include a photosensitive material. Therefore, forming the portions of the via holes in the fifth insulating layer 126 by using another mask described above may include performing the exposure and development process by a mask to form the portions of the via holes in the fifth insulating layer 126. However, the material of the fifth insulating layer 126 and the forming method of the via holes in the fifth insulating layer 126 are not limited herein. In this variant embodiment, since another mask is required to form the portions of the via holes disposed in the fifth insulating layer 126, 10 or 11 masks are required to manufacture the touch display device of this variant embodiment.

Figure 16:
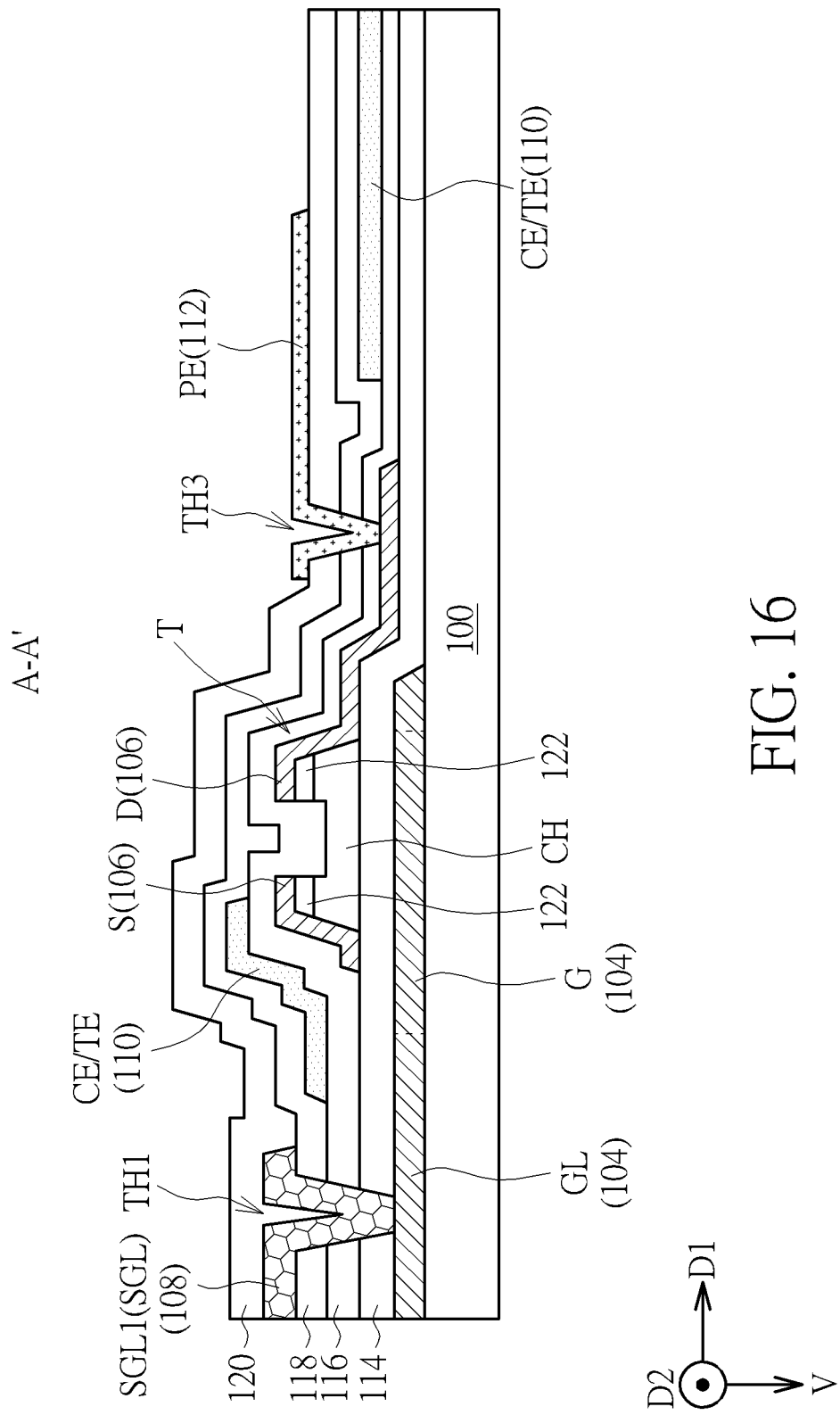
FIG. 16 is a structural sectional-view schematic diagram of a second variant embodiment of the third embodiment.
Figure 17:
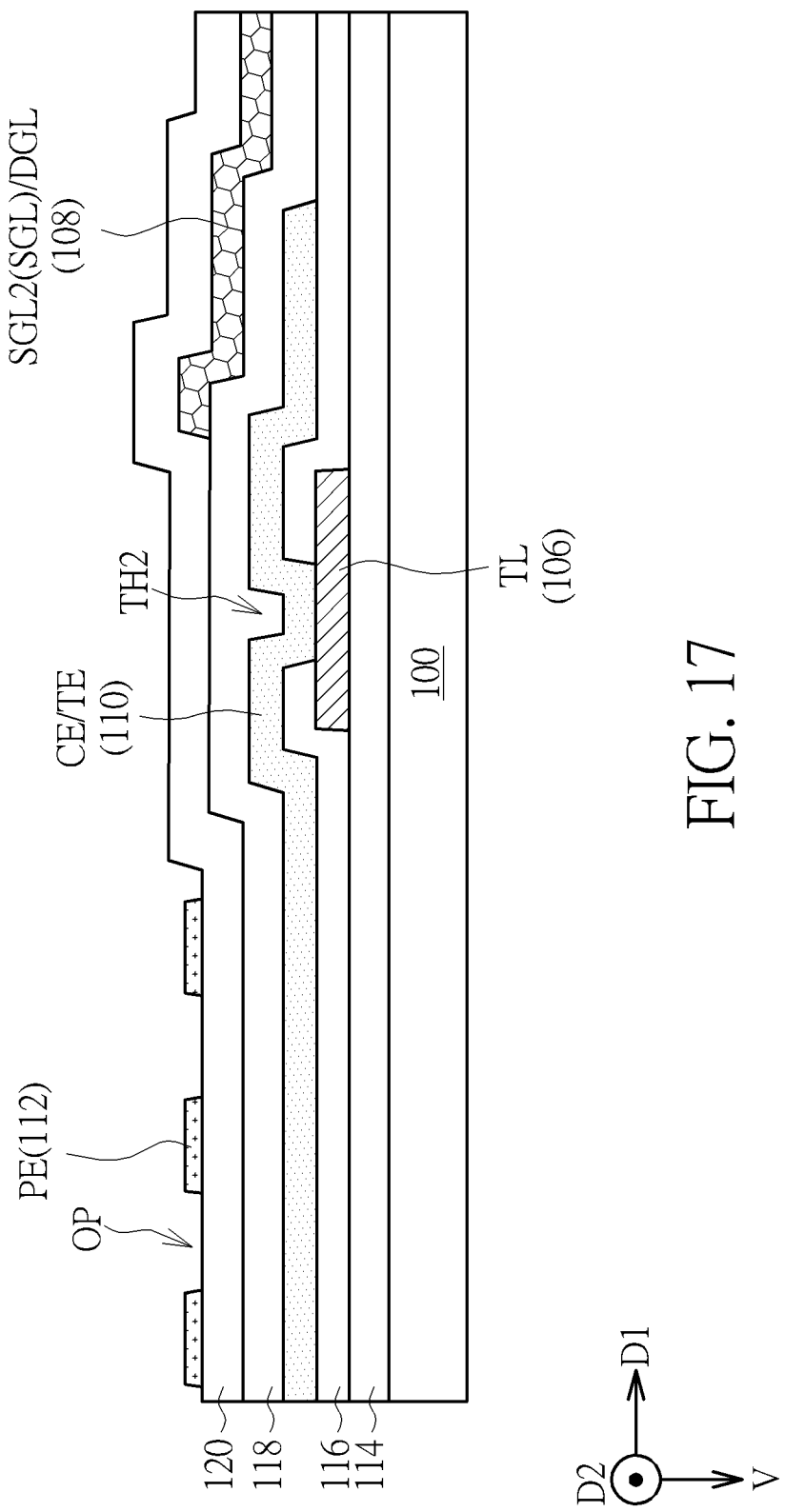
FIG. 17 is another structural sectional-view schematic diagram of the second variant embodiment of the third embodiment.

Please refer to FIG. 16 and FIG. 17, FIG. 16 is a structural sectional-view schematic diagram of a second variant embodiment of the third embodiment, and FIG. 17 is another structural sectional-view schematic diagram of the second variant embodiment of the third embodiment. The partial top-view schematic diagram of a display region of a touch display device of the second variant embodiment of the third embodiment may refer to FIG. 11. The difference between the second variant embodiment and the third embodiments is that the first transparent conductive layer 110 is disposed on the second insulating layer 116, the third insulating layer 118 is disposed on the first transparent conductive layer 110, the third metal layer 108 is disposed on the third insulating layer 118, and the fourth insulating layer 120 is disposed on the third metal layer 108 in this variant embodiment.

The difference between the manufacturing method of this variant embodiment and the manufacturing method of the third embodiment is that the first transparent conductive layer 110 is formed after the third metal layer 108 in the third embodiment, but the first transparent conductive layer 110 is formed before the third metal layer 108 in this variant embodiment. For example, a fourth mask is used to form the second metal layer 106 first, and then the second insulating layer 116 is formed on the second metal layer 106. The steps before forming the second insulating layer 116 may be the same as those in the third embodiment, which will not be described redundantly. Additionally, a fifth mask is used to form the via hole TH2 in the second insulating layer 116 (as shown in FIG. 17). Then, a sixth mask is used to form the first transparent conductive layer 110 on the second insulating layer 116, and the touch electrode TE of the first transparent conductive layer 110 extends into the via hole TH2 and is connected to the touch signal line TL of the second metal layer 106.

Then, the third insulating layer 118 is formed on the first transparent conductive layer 110, and a seventh mask is used to form the via hole TH1 in the third insulating layer 118, the second insulating layer 116 and the first insulating layer 114 (as shown in FIG. 16). In this embodiment, the third insulating layer 118, the second insulating layer 116 and the first insulating layer 114 may be etched in an etching process to form the via hole TH1. In addition, in some embodiments, a portion of the via hole TH1 disposed in the second insulating layer 116 and/or the first insulating layer 114 may be formed together in the step of forming the via hole TH2, and the other portion of the via hole TH2 disposed in the third insulating layer 118 may be formed in this etching process.

Then, an eighth mask is used to form the third metal layer 108 on the third insulating layer 118. As shown in FIG. 14, the scan signal line SGL of the third metal layer 108 extends into the via hole TH1 and is connected to the scan line GL of the first metal layer 104. Then, the fourth insulating layer 120 is formed on the third metal layer 108, and the following steps may be the same as those in the third embodiment, and will not be described redundantly. In the second variant embodiment, since the third mask is optional, 9 or 10 masks are required to manufacture the touch display device of the second variant embodiment.

In this variant embodiment, the first transparent conductive layer 110 is formed after the second metal layer 106, the third metal layer 108 is formed after the first transparent conductive layer 110, and the data line DL, the common electrode CE and the scan signal line SGL are respectively formed by the second metal layer 106, the first transparent conductive layer 110 and the third metal layer 108. Therefore, the common electrode CE is disposed between the scan signal line SGL and the data line DL (such as the source S in FIG. 14), and the interference between the signal of the scan signal line SGL and the signal of the data line DL is reduced.

Figure 18:
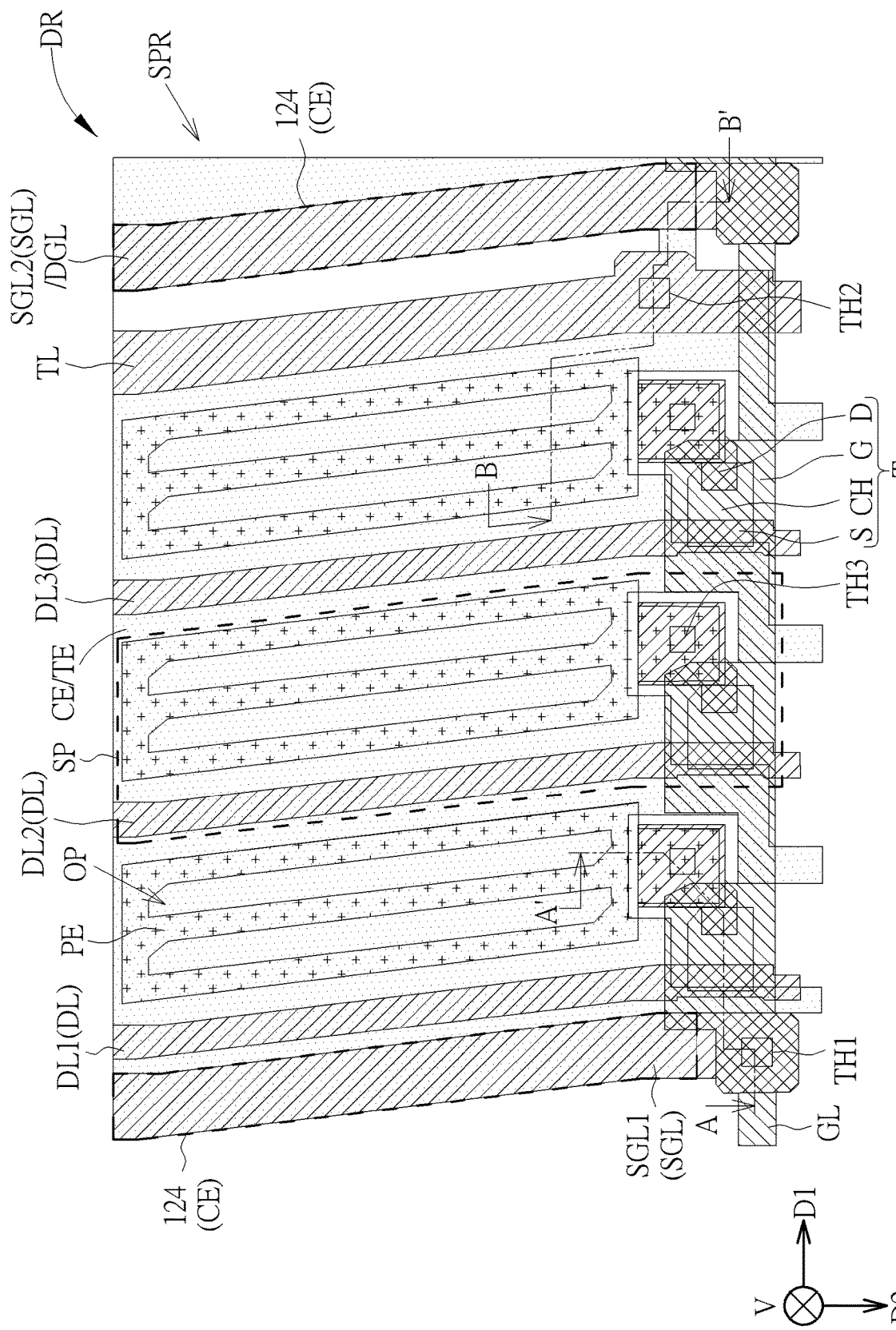
FIG. 18 is a partial top-view schematic diagram of a display region of a touch display device of a fourth embodiment according to the present invention.
Figure 19:
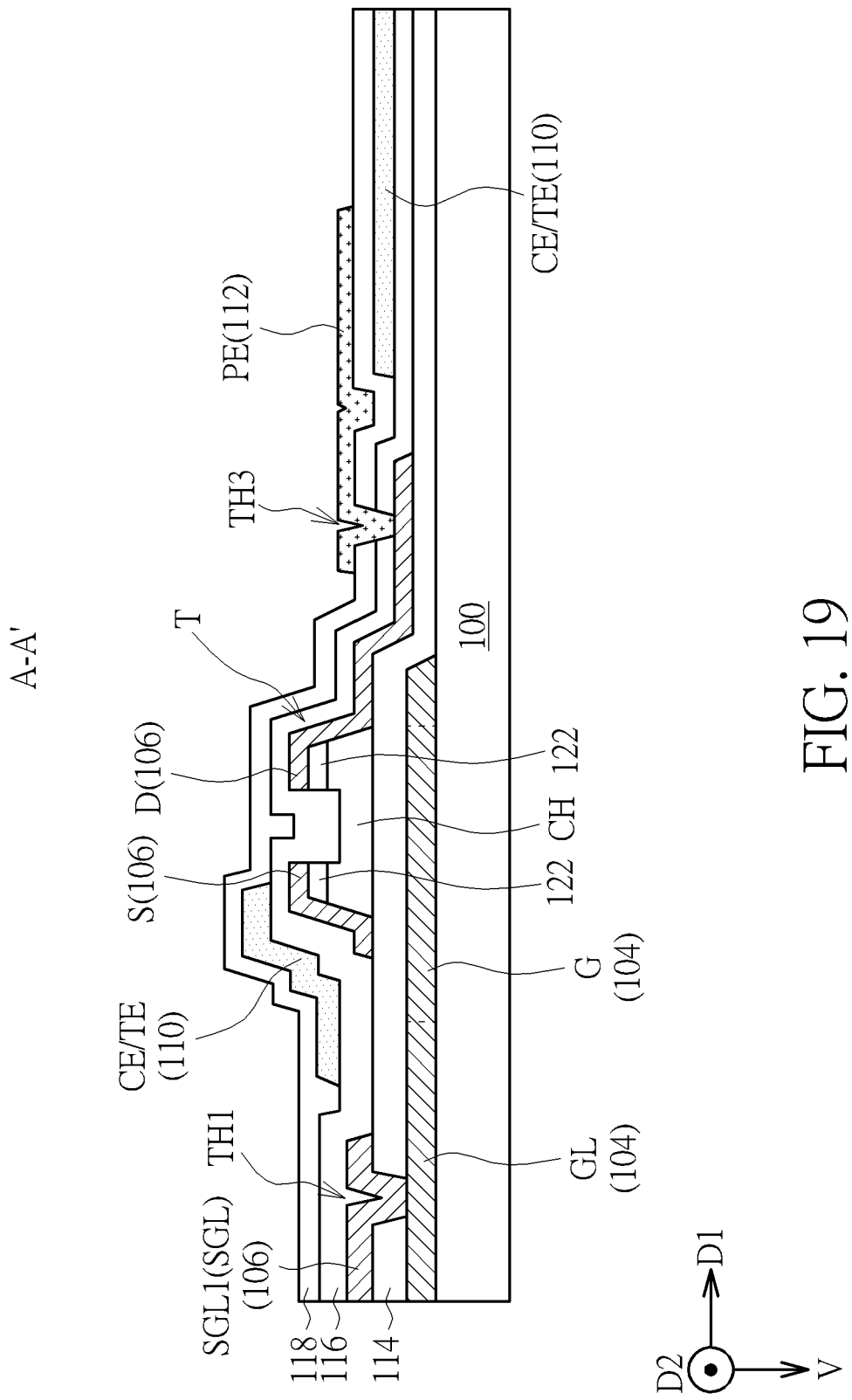
FIG. 19 is a structural sectional-view schematic diagram along the section line A-A' in FIG. 18.
Figure 20:
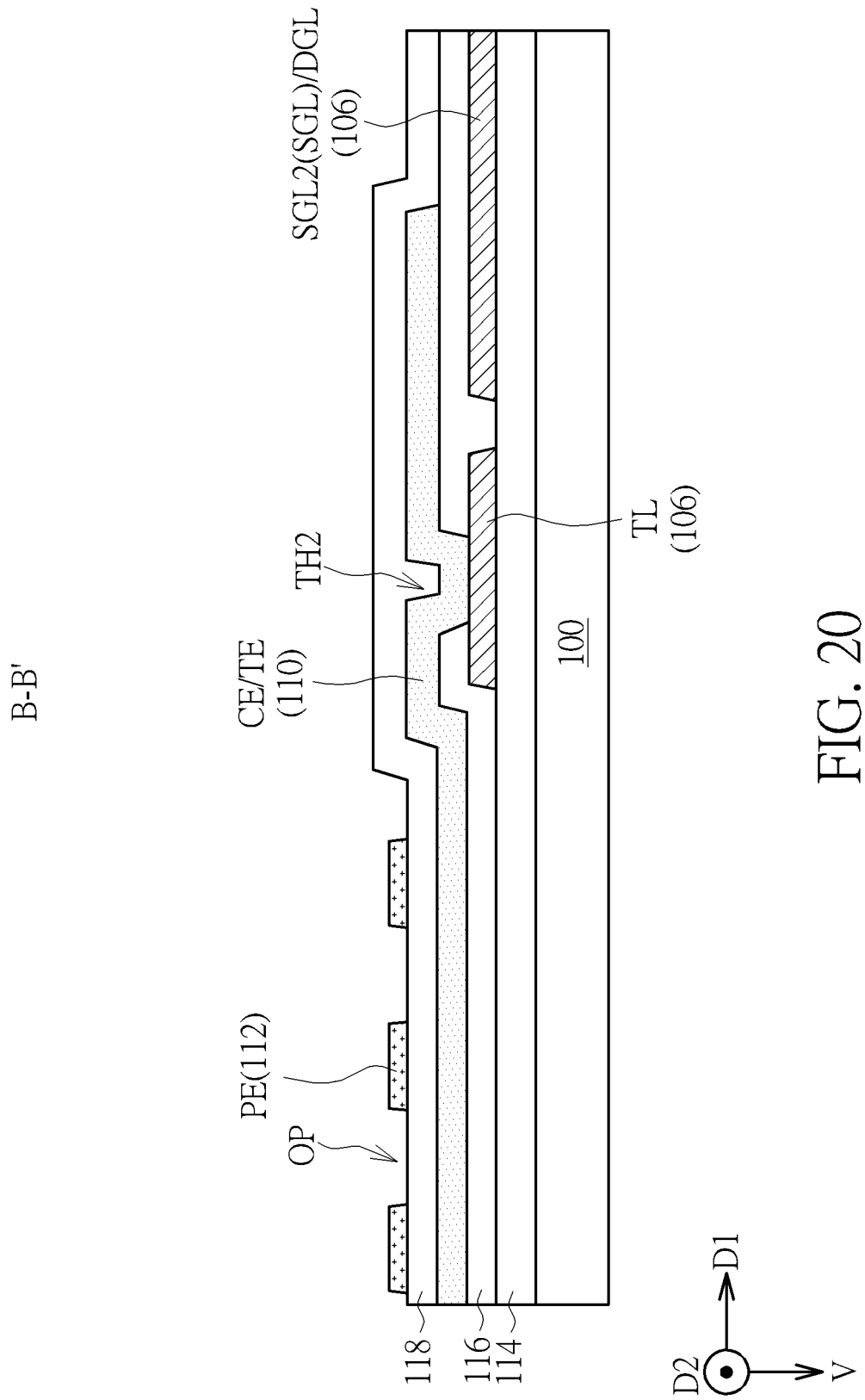
FIG. 20 is a structural sectional-view schematic diagram along the section line B-B' in FIG. 18.

Please refer to FIG. 18 to FIG. 20, FIG. 18 is a partial top-view schematic diagram of a display region of a touch display device of a fourth embodiment according to the present invention, FIG. 19 is a structural sectional-view schematic diagram along the section line A-A' in FIG. 18, and FIG. 20 is a structural sectional-view schematic diagram along the section line B-B' in FIG. 18. The difference between this embodiment and the third embodiment is that the second metal layer 106 of this embodiment further includes the signal lines SGL and the dummy signal lines DGL, and the touch display device 10 of this embodiment does not include the third metal layer 108 and the fourth insulating layer 120 in the third embodiment, so the process steps may be omitted to save costs.

As shown in FIG. 19, the scan signal line SGL of the second metal layer 106 is connected to the scan line GL of the first metal layer 104 through the via hole TH1, and the via hole TH1 of this embodiment penetrates through the first insulating layer 114. The first transparent conductive layer 110 of this embodiment is disposed on the second insulating layer 116. As shown in FIG. 20, the touch electrode TE of the first transparent conductive layer 110 is connected to the touch signal line TL of the second metal layer 106 through the via hole TH2, and the via hole TH2 of this embodiment penetrates through the second insulating layer 116. In addition, as shown in FIG. 19 or FIG. 20, the third insulating layer 118 of this embodiment is disposed between the first transparent conductive layer 110 and the second transparent conductive layer 112, the via hole TH3 penetrates through the third insulating layer 118 and the second insulating layer 116, and the pixel electrode PE of the second transparent conductive layer 112 is connected to the drain D of the second metal layer 106 through the via hole TH3.

Please refer to FIG. 19 and FIG. 20, the manufacturing method of the touch display device 10 of this embodiment may include the following steps, but the sequence of the steps is not limited to the following description. First, the substrate 100 is provided, and a first mask is used to form the first metal layer 104 on the substrate 100. Then, the first insulating layer 114 is formed on the first metal layer 104.

Then, a second mask is used to form the semiconductor layer CH and the ohmic contact layer 122 on the first insulating layer 114. After forming the semiconductor layer CH and the ohmic contact layer 122, a third mask is used to form the via hole TH1 in the first insulating layer 114. Then, a fourth mask is used to form the second metal layer 106 on the first insulating layer 114. As shown in FIG. 19, the scan signal line SGL1 of the second metal layer 106 extends into the via hole TH1 and is connected to the scan line GL of the first metal layer 104.

Then, the second insulating layer 116 is formed on the second metal layer 106, and a fifth mask is used to form the via hole TH2 in the second insulating layer 116. Then, a sixth mask is used to form the first transparent conductive layer 110 on the second insulating layer 116. As shown in FIG. 20, the touch electrode TE of the first transparent conductive layer 110 extends into the via hole TH2 and is connected to the touch signal line TL of the second metal layer 106.

Then, the third insulating layer 118 is formed on the first transparent conductive layer 110, and a seventh mask is used to form the via hole TH3 in the third insulating layer 118 and the second insulating layer 116. In this embodiment, the third insulating layer 118 and the second insulating layer 116 may be etched in an etching process to form the via hole TH3. In addition, in some embodiments, a portion of the via hole TH3 disposed in the second insulating layer 116 may be formed together in the step of forming the via hole TH2, and the other portion of the via hole TH3 disposed in the third insulating layer 118 may be formed in the step of this etching process.

Then, an eighth mask is used to form the second transparent conductive layer 112 on the third insulating layer 118. As shown in FIG. 19, the pixel electrode PE of the second transparent conductive layer 112 extends into the via hole TH3 and is connected to the drain D of the second metal layer 106. Therefore, 8 masks are required to manufacture the touch display device of this embodiment.

As shown in FIG. 18, the common electrode CE of this embodiment may partially cover the scan signal line SGL, so as to prevent the liquid crystal molecules from being affected by the electrical field generated by the scan signal line SGL. In addition, other features of this embodiment may be the same as those of the third embodiment.

Figure 21:
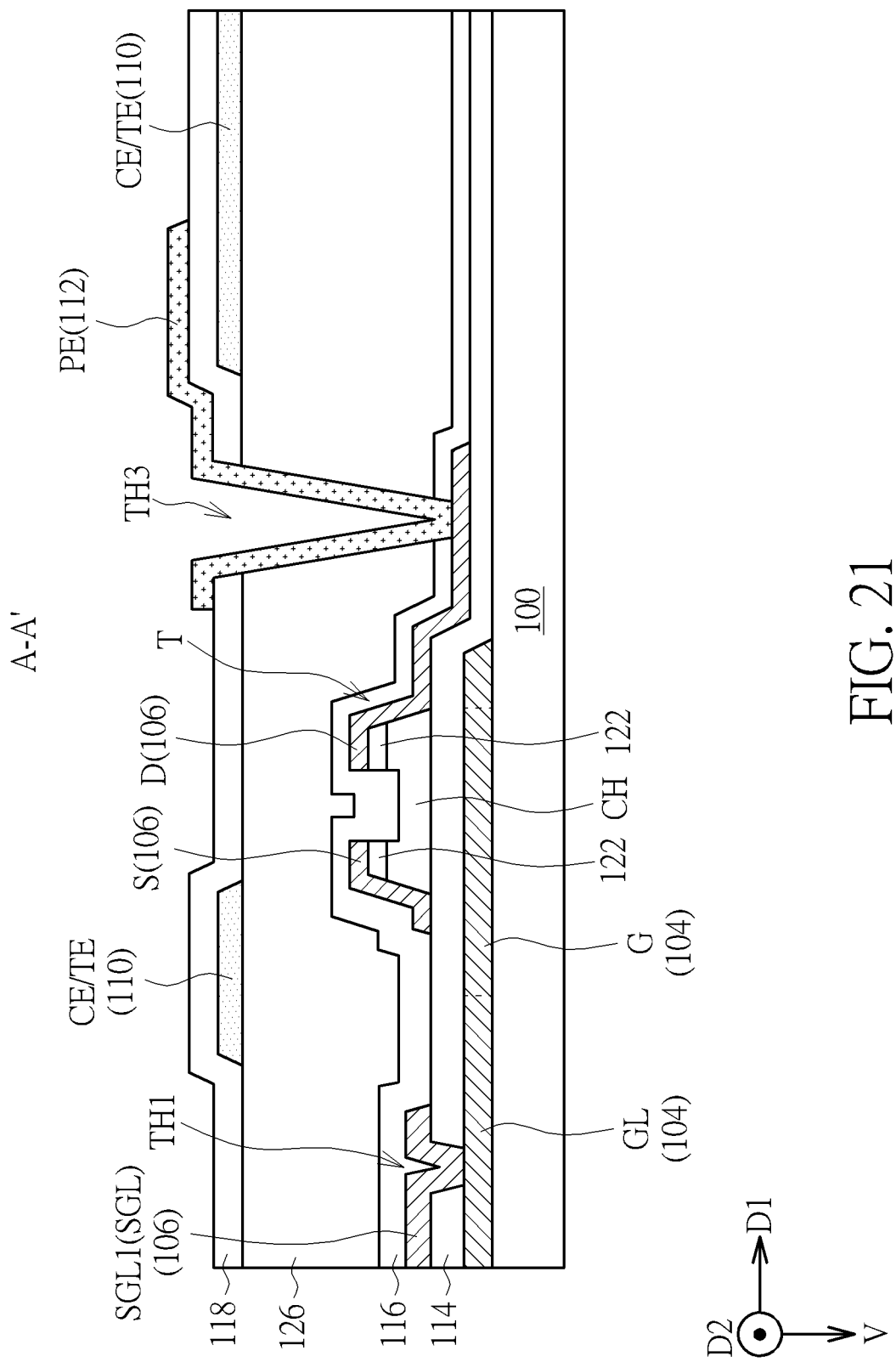
FIG. 21 is a structural sectional-view schematic diagram of a variant embodiment of the fourth embodiment.
Figure 22:
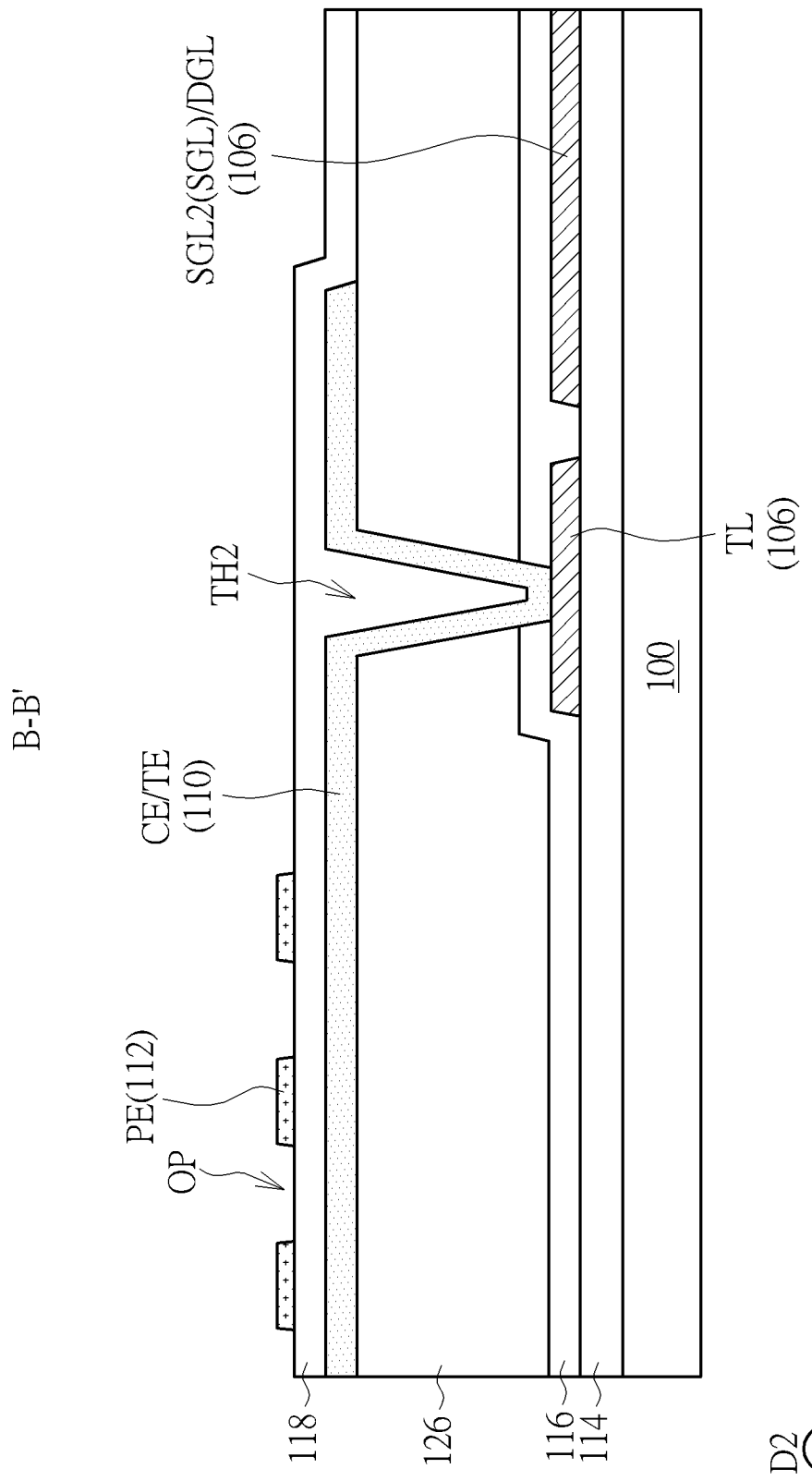
FIG. 22 is another structural sectional-view schematic diagram of the variant embodiment of the fourth embodiment.

Please refer to FIG. 21 and FIG. 22, FIG. 21 is a structural sectional-view schematic diagram of a variant embodiment of the fourth embodiment, and FIG. 22 is another structural sectional-view schematic diagram of the variant embodiment of the fourth embodiment. The partial top-view schematic diagram of a display region of a touch display device of the variant embodiment of the fourth embodiment may refer to FIG. 18. The difference between this variant embodiment and the fourth embodiment is that a fifth insulating layer 126 is formed on the second insulating layer 116 after forming the second insulating layer 116 and before forming the first transparent conductive layer 110, thus the fifth insulating layer 126 is disposed between the second insulating layer 116 and the first transparent conductive layer 110.

The via hole TH2 may penetrate through the second insulating layer 116 and the fifth insulating layer 126, and the via hole TH3 may penetrate through the second insulating layer 116, the fifth insulating layer 126 and the third insulating layer 118. In this variant embodiment, the second insulating layer 116 and the fifth insulating layer 126 are disposed between the second metal layer 106 and the first transparent conductive layer 110, and the first insulating layer 114, the second insulating layer 116 and the fifth insulating layer 126 are disposed between the first metal layer 104 and the first transparent conductive layer.

Compared with the fourth embodiment, in which only the second insulating layer 116 is disposed between the second metal layer 106 and the first transparent conductive layer 110, the first transparent conductive layer 110 of this variant embodiment may be further away from the second metal layer 106 and the first metal layer 104.

The second insulating layer 116 and the fifth insulating layer 126 may be disposed between the common electrode CE and the data line DL, and the first insulating layer 114, the second insulating layer 116 and the fifth insulating layer 126 may be disposed between the common electrode CE and the scan line GL, and the distance between the common electrode CE and the data line DL and the distance between the common electrode CE and the scan line GL are increased. Therefore, the capacitance between the common electrode CE and the data line DL and the capacitance between the common electrode CE and the scan line GL may be reduced, and the loading of the data line DL and the loading of the scan line GL are further reduced, thereby improving the display quality of the image.

In this variant embodiment, the fifth insulating layer 126 may also be served as a planarization layer to planarize the uneven upper surface of the second insulating layer 116. For example, the fifth insulating layer 126 may include an organic material and formed by a coating method (e.g., spin coating or slit coating), but the material and the forming method of the fifth insulating layer 126 are not limited herein. In addition, the thickness of the fifth insulating layer 126 may be greater than the thickness of any one of the first insulating layer 114, the second insulating layer 116, the third insulating layer 118 and the fourth insulating layer 120, so as to increase the distance between the scan signal line SGL and the data line DL and further planarize the surface. For example, the thickness of the fifth insulating layer 126 may be in a range from 1 micrometer to 5 micrometers, but not limited herein.

The difference between the manufacturing method of the touch display device of this variant embodiment and the manufacturing method of the touch display device of the fourth embodiment is that, a fifth mask is used to form a portion of the via hole TH2 in the second insulating layer 116 after the second insulating layer 116 is formed on the second metal layer 106 in this variant embodiment. Then, the fifth insulating layer 126 is formed on the second insulating layer 116, and another mask is used to form a portion of the via hole TH2 and a portion of the via hole TH3 in the fifth insulating layer 126.

Then, a sixth mask is used to form the first transparent conductive layer 110 on the second insulating layer 116. As shown in FIG. 22, the touch electrode TE of the first transparent conductive layer 110 extends into the via hole TH2 and is connected to the touch signal line TL of the second metal layer 106. Other features of this variant embodiment are similar to the fourth embodiment, and will not be described redundantly herein. In this embodiment, the fifth insulating layer 126 may include a photosensitive material. Therefore, forming the portions of the via holes in the fifth insulating layer 126 by using another mask described above includes performing the exposure and development process by a mask to form the portions of the via holes in the fifth insulating layer 126. However, the material of the fifth insulating layer 126 and the forming method of the via holes in the fifth insulating layer 126 are not limited herein. In this variant embodiment, since another mask is required to form the portions of the via holes disposed in the fifth insulating layer 126, 9 masks are required to manufacture the touch display device of this variant embodiment.

From the description described above, in the touch display device of the present invention, the scan signal lines each extending along the second direction are disposed in the display region, and the gate driving circuit is disposed below the display region in the second direction, so that the scan lines or the gate driving circuit are prevented from being disposed in the peripheral region on the left and right sides of the display region, and the border widths on the left and right sides of the touch display device may be effectively reduced. The touch display device includes a plurality of insulating layers and a via hole. The via hole penetrates through at least one of the plurality of insulating layers, the scan line and the scan signal line are formed by different metal layers in the display region, and the scan line and the scan signal line are electrically connected with each other through the via hole. In addition, the influence of the electric field on the liquid crystal may be effectively shielded through partially covering the scan signal line by the common electrode of the first transparent conductive layer or the second transparent conductive layer. On the other hand, each of the pixels is disposed with a scan signal line or a dummy signal line, so that the aperture ratio of different pixels may be substantially equal, and the display quality of the image can be improved. Furthermore, the scan signal lines and the dummy signal lines may be uniformly distributed in the display region through the method provided by the present invention, and the display quality of the image can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch display device, having a display region and a peripheral region, the touch display device comprising:
   a substrate;
   a first metal layer disposed on the substrate, wherein the first metal layer comprises a scan line and a gate of a thin film transistor;
   a first insulating layer disposed on the first metal layer;
   a second metal layer disposed on the first insulating layer, wherein the second metal layer comprises a data line, a touch signal line and a source and a drain of the thin film transistor;
   a first transparent conductive layer disposed on the first insulating layer, wherein the first transparent conductive layer comprises a pixel electrode, and the pixel electrode is electrically connected to the drain of the thin film transistor;
   a second insulating layer and a third insulating layer disposed on the second metal layer and the first transparent conductive layer, wherein the third insulating layer is disposed on the second insulating layer;
   a third metal layer disposed between the second insulating layer and the third insulating layer, wherein the third metal layer comprises a scan signal line; and
   a second transparent conductive layer disposed on the third insulating layer, wherein the second transparent conductive layer comprises a touch electrode,
   wherein
   the scan line and the data line are disposed on the substrate, and an extending direction of the scan line in the display region is different from an extending direction of the data line in the display region;
   the thin film transistor is disposed on the substrate and in the display region, the scan line is electrically connected to the gate of the thin film transistor, and the data line is electrically connected to the source of the thin film transistor;
   the scan signal line is disposed on the substrate, an extending direction of the scan signal line in the display region is different from the extending direction of the scan line in the display region, and the scan signal line is electrically connected to the scan line; and
   the touch signal line and the touch electrode are disposed on the substrate, and the touch signal line is electrically connected to the touch electrode.

2. The touch display device according to claim 1, wherein in the display region, the scan line extends along a first direction, the data line and the scan signal line extend along a second direction, and the first direction is not parallel to the second direction.

3. The touch display device according to claim 1, further comprising a via hole disposed on the substrate, wherein the via hole penetrates through the first insulating layer and the second insulating layer, and the scan line and the scan signal line are electrically connected with each other through the via hole.

4. The touch display device according to claim 1, wherein the scan line is a first scan line, the data line is a first data line, the scan signal line is a first scan signal line, the thin film transistor is a first thin film transistor, and the touch display device further comprises a second thin film transistor, a third thin film transistor, a second data line, a third data line, a second scan line and a second scan signal line, wherein an extending direction of the second scan line in the display region is parallel to the extending direction of the first scan line in the display region, an extending direction of the second scan signal line in the display region is different from the extending direction of the second scan line in the display region, the second scan signal line is electrically connected to the second scan line, the second data line is electrically connected a source of the second thin film transistor, and the third data line is electrically connected to a source of the third thin film transistor, wherein the first scan signal line, the first data line, the second data line, the third data line, the touch signal line and the second scan signal line are sequentially disposed along the extending direction of the first scan line in the display region.

5. The touch display device according to claim 1, further comprising a dummy signal line, wherein an extending direction of the dummy signal line in the display region is parallel to the extending direction of the scan signal line in the display region, and the dummy signal line is electrically isolated from the scan line.

6. The touch display device according to claim 5, wherein the data line is a first data line, the thin film transistor is a first thin film transistor, and the touch display device further comprises a second thin film transistor, a third thin film transistor, a second data line and a third data line, wherein the second data line is electrically connected to a source of the second thin film transistor, and the third data line is electrically connected to a source of the third thin film transistor, wherein the scan signal line, the first data line, the second data line, the third data line, the touch signal line and the dummy signal line are sequentially disposed along the extending direction of the scan line in the display region.

7. A touch display device, having a display region and a peripheral region, the touch display device comprising:
   a substrate;
   a first metal layer disposed on the substrate, wherein the first metal layer comprises a scan line and a gate of a thin film transistor;
   a first insulating layer disposed on the first metal layer;

a second metal layer disposed on the first insulating layer, wherein the second metal layer comprises a data line, a scan signal line, a touch signal line and a source and a drain of the thin film transistor;

a first transparent conductive layer disposed on the first insulating layer, wherein the first transparent conductive layer comprises a pixel electrode, and the pixel electrode is electrically connected to the drain of the thin film transistor;

a second insulating layer disposed on the second metal layer and the first transparent conductive layer; and a second transparent conductive layer disposed on the second insulating layer, wherein the second transparent conductive layer comprises a touch electrode, wherein the scan line and the data line are disposed on the substrate, and an extending direction of the scan line in the display region is different from an extending direction of the data line in the display region;

the thin film transistor is disposed on the substrate and in the display region, the scan line is electrically connected to the gate of the thin film transistor, and the data line is electrically connected to the source of the thin film transistor;

the scan signal line is disposed on the substrate, an extending direction of the scan signal line in the display region is different from the extending direction of the scan line in the display region, and the scan signal line is electrically connected to the scan line; and the touch signal line and the touch electrode are disposed on the substrate, and the touch signal line is electrically connected to the touch electrode.

8. A touch display device, having a display region and a peripheral region, the touch display device comprising:

a substrate;

a first metal layer disposed on the substrate, wherein the first metal layer comprises a scan line and a gate of a thin film transistor;

a first insulating layer disposed on the first metal layer;

a second metal layer disposed on the first insulating layer, wherein the second metal layer comprises a data line, a touch signal line and a source and a drain of the thin film transistor;

a second insulating layer disposed on the second metal layer;

a third metal layer disposed on the second insulating layer, wherein the third metal layer comprises a scan signal line;

a third insulating layer disposed on the third metal layer;

a first transparent conductive layer disposed on the third insulating layer, wherein the first transparent conductive layer comprises a touch electrode;

a fourth insulating layer disposed on the first transparent conductive layer; and a second transparent conductive layer disposed on the fourth insulating layer, wherein the second transparent conductive layer comprises a pixel electrode, and the pixel electrode is electrically connected to the drain of the thin film transistor, wherein the scan line and the data line are disposed on the substrate, and an extending direction of the scan line in the display region is different from an extending direction of the data line in the display region;

the thin film transistor is disposed on the substrate and in the display region, the scan line is electrically connected to the gate of the thin film transistor, and the data line is electrically connected to the source of the thin film transistor;

the scan signal line is disposed on the substrate, an extending direction of the scan signal line in the display region is different from the extending direction of the scan line in the display region, and the scan signal line is electrically connected to the scan line; and the touch signal line and the touch electrode are disposed on the substrate, and the touch signal line is electrically connected to the touch electrode.

9. The touch display device according to claim 8, further comprising a fifth insulating layer disposed between the second insulating layer and the third metal layer.

10. A touch display device, having a display region and a peripheral region, the touch display device comprising:

a substrate;

a first metal layer disposed on the substrate, wherein the first metal layer comprises a scan line and a gate of a thin film transistor;

a first insulating layer disposed on the first metal layer;

a second metal layer disposed on the first insulating layer, wherein the second metal layer comprises a data line, a touch signal line and a source and a drain of the thin film transistor;

a second insulating layer disposed on the second metal layer;

a first transparent conductive layer disposed on the second insulating layer, wherein the first transparent conductive layer comprises a touch electrode;

a third insulating layer disposed on the first transparent conductive layer;

a third metal layer disposed on the third insulating layer, wherein the third metal layer comprises a scan signal line;

a fourth insulating layer disposed on the third metal layer; and a second transparent conductive layer disposed on the fourth insulating layer, wherein the second transparent conductive layer comprises a pixel electrode, and the pixel electrode is electrically connected to the drain of the thin film transistor, wherein the scan line and the data line are disposed on the substrate, and an extending direction of the scan line in the display region is different from an extending direction of the data line in the display region;

the thin film transistor is disposed on the substrate and in the display region, the scan line is electrically connected to the gate of the thin film transistor, and the data line is electrically connected to the source of the thin film transistor;

the scan signal line is disposed on the substrate, an extending direction of the scan signal line in the display region is different from the extending direction of the scan line in the display region, and the scan signal line is electrically connected to the scan line; and the touch signal line and the touch electrode are disposed on the substrate, and the touch signal line is electrically connected to the touch electrode.

11. A touch display device, having a display region and a peripheral region, the touch display device comprising:

a substrate;

a first metal layer disposed on the substrate, wherein the first metal layer comprises a scan line and a gate of a thin film transistor;

a first insulating layer disposed on the first metal layer;

a second metal layer disposed on the first insulating layer, wherein the second metal layer comprises a data line, a scan signal line, a touch signal line and a source and a drain of the thin film transistor;

a second insulating layer disposed on the second metal layer;

a first transparent conductive layer disposed on the second insulating layer, wherein the first transparent conductive layer comprises a touch electrode;

a third insulating layer disposed on the first transparent conductive layer; and a second transparent conductive layer disposed on the third insulating layer, wherein the second transparent conductive layer comprises a pixel electrode, and the pixel electrode is electrically connected to the drain of the thin film transistor, wherein the scan line and the data line are disposed on the substrate, and an extending direction of the scan line in the display region is different from an extending direction of the data line in the display region;

the thin film transistor is disposed on the substrate and in the display region, the scan line is electrically connected to the gate of the thin film transistor, and the data line is electrically connected to the source of the thin film transistor;

the scan signal line is disposed on the substrate, an extending direction of the scan signal line in the display region is different from the extending direction of the scan line in the display region, and the scan signal line is electrically connected to the scan line; and the touch signal line and the touch electrode are disposed on the substrate, and the touch signal line is electrically connected to the touch electrode.

12. The touch display device according to claim 11, further comprising a fifth insulating layer disposed between the second insulating layer and the first transparent conductive layer.

13. The touch display device according to claim 7, wherein in the display region, the scan line extends along a first direction, the data line and the scan signal line extend along a second direction, and the first direction is not parallel to the second direction.

14. The touch display device according to claim 7, further comprising a via hole disposed on the substrate, wherein the via hole penetrates through the first insulating layer, and the scan line and the scan signal line are electrically connected with each other through the via hole.

15. The touch display device according to claim 8, wherein in the display region, the scan line extends along a first direction, the data line and the scan signal line extend along a second direction, and the first direction is not parallel to the second direction.

16. The touch display device according to claim 8, further comprising a via hole disposed on the substrate, wherein the via hole penetrates through the first insulating layer and the second insulating layer, and the scan line and the scan signal line are electrically connected with each other through the via hole.

17. The touch display device according to claim 10, wherein in the display region, the scan line extends along a first direction, the data line and the scan signal line extend along a second direction, and the first direction is not parallel to the second direction.

18. The touch display device according to claim 10, further comprising a via hole disposed on the substrate, wherein the via hole penetrates through the first insulating layer, the second insulating layer and the third insulating layer, and the scan line and the scan signal line are electrically connected with each other through the via hole.

19. The touch display device according to claim 11, wherein in the display region, the scan line extends along a first direction, the data line and the scan signal line extend along a second direction, and the first direction is not parallel to the second direction.

20. The touch display device according to claim 11, further comprising a via hole disposed on the substrate, wherein the via hole penetrates through the first insulating layer, and the scan line and the scan signal line are electrically connected with each other through the via hole.

* * * * *